(12) United States Patent
Jung et al.

(10) Patent No.: US 12,418,280 B2
(45) Date of Patent: Sep. 16, 2025

(54) STATIC CHANGE SENSE FLIP-FLOP

(71) Applicant: Korea Advanced Institute of Science and Technology, Daejeon (KR)

(72) Inventors: Wanyeong Jung, Daejeon (KR); Byung Jin Cho, Daejeon (KR); YoungKeun Park, Daejeon (KR); Kyounghun Kang, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 95 days.

(21) Appl. No.: 18/506,419

(22) Filed: Nov. 10, 2023

(65) Prior Publication Data
US 2025/0158599 A1    May 15, 2025

(51) Int. Cl.
*H03K 3/037*     (2006.01)
*H03K 3/012*     (2006.01)

(52) U.S. Cl.
CPC ........... *H03K 3/0372* (2013.01); *H03K 3/012* (2013.01)

(58) Field of Classification Search
CPC .............................. H03K 3/0372; H03K 3/012
See application file for complete search history.

(56) References Cited

U.S. PATENT DOCUMENTS

| | | | |
|---|---|---|---|
| 2008/0186070 A1* | 8/2008 | Iyer .................... | H03K 3/35606 327/202 |
| 2019/0319612 A1* | 10/2019 | Nandi .............. | H03K 3/356191 |
| 2022/0397607 A1* | 12/2022 | Kang .................... | G11C 7/222 |
| 2024/0339992 A1* | 10/2024 | Goyal ............ | G01R 31/318544 |

* cited by examiner

*Primary Examiner* — Sibin Chen
(74) *Attorney, Agent, or Firm* — Heslin Rothenberg Farley & Mesiti P.C.

(57) ABSTRACT

Provided is a static change-sensing flip-flop. The static change-sensing flip-flop proposed herein includes a master latch and a slave latch configured to transfer and maintain input data according to a clock, and the master latch includes a pull-up network complementary circuit configured to connect to a master latch node (DN) and to prevent output of wrong data in a pull-up network operation while operating according to input data (D); a pull-down network complementary circuit configured to connect to the master latch node (DN) and to prevent output of wrong data in a pull-down network operation while operating according to a clock (CK); and a change-sensing circuit configured to prevent output of wrong data by a clock node (CS) and the master latch node (DN) in the pull-down network operation of the master latch.

2 Claims, 40 Drawing Sheets

Z: Keeper  X: 1430
Y: 1410   W: 1420

STATIC CHANGE SENSE FLIP-FLOP

BACKGROUND

Field of the Invention

The present invention relates to a static change-sensing flip-flop.

Description of the Related Art

The development of Internet of things (IoT) is having a significant impact on our lives overall, including healthcare, smart city construction, and transportation. The biggest obstacle to the growth of such IoT is Power and energy issues. One of solutions to solve the issues is to reduce a system operating voltage. That is, one of innovative methods to reduce power in a digital system is to operate in a near-threshold voltage (NTV) region.

However, in the case of reducing the system operating voltage in a threshold voltage region, a sequential logic element is vulnerable to a process variation and accordingly, instability of a system operation increases.

A flip-flop that is most essential for the sequential logic element has a significant impact on power, area, and operating speed of a digital system, so research is being conducted to design an energy efficient and robust flip-flop. As a necessary condition for such flip-flop, a fully static, contention-free, no redundant clock transition, no redundant transistor condition is required.

Recent technologies perform verification under one condition, that is, only when a clock (CK) frequency is faster than a frequency of input data D, in a process of verifying a fully static and contention-free characteristic. However, in the case of performing simulation under different condition, that is, when the frequency of input data is faster than the CK frequency, instability in a flip-flop operation may be discovered. Therefore, there is a need for a flip-flop that meets a necessary condition of flip-flop even when the frequency of input data D is faster than the CK frequency.

SUMMARY

A technical subject to be achieved by the present invention is to provide a flip-flop in a new structure that meets a fully static and contention-free condition, which is a necessary condition of flip-flop, even when a frequency of input data is faster than a clock frequency in a process of verifying a fully static and contention-free characteristic of the flip-flop, and also eliminates a redundant clock transition and improves an operating speed and power consumption using an existing change-sensing scheme.

According to an example embodiment, a static change-sensing flip-flop includes a master latch and a slave latch configured to transfer and maintain input data according to a clock, and the master latch includes a pull-up network complementary circuit configured to connect to a discharge node (DN) of the master latch and to prevent output of wrong data in a pull-up network operation while operating according to input data (D), a pull-down network complementary circuit configured to connect to the discharge node (DN) of the master latch and to prevent output of wrong data in a pull-down network operation while operating according to a clock (CK), and a change-sensing circuit configured to prevent output of wrong data by a clock node (CS) and the discharge node (DN) in the pull-down network operation of the master latch.

According to an aspect, the pull-down network complementary circuit may generate a pull-down network to prevent a master latch node (DN) from floating when input data (D) changes from 1 to 0 while input data (D)=1, clock (CK)=1, clock node (CS)=1, master latch node (DN)=0, and output data (Q)=1.

According to another aspect, the pull-up network complementary circuit may block a pull-up network when input data (D) changes from 0 to 1 while input data (D)=0, clock (CK)=1, clock node (CS)=1, down node (DN)=1, and output data (Q)=1.

According to example embodiments of the present invention, while meeting a fully static and contention-free condition, which is a necessary condition of flip-flop, even when a frequency of input data is faster than a clock frequency in a process of verifying a fully static and contention-free characteristic of the flip-flop, it is possible to eliminate a redundant clock transition and to improve an operating speed and power consumption using an existing change-sensing scheme.

DETAILED DESCRIPTION

Hereinafter, example embodiments of the present invention will be described with reference to the accompanying drawings.

Figure 1:
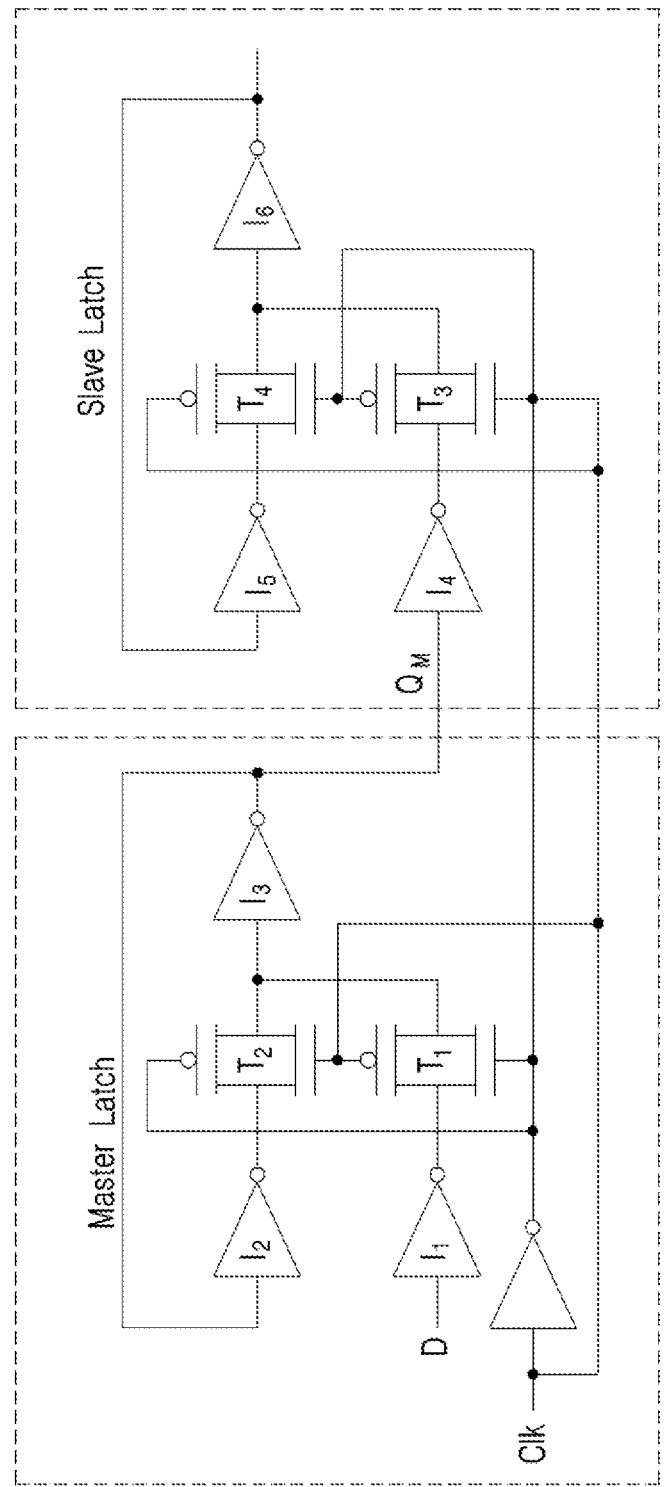
FIGS. 1A and 1B illustrate a flip-flop according to the related art.
Figure 1B:
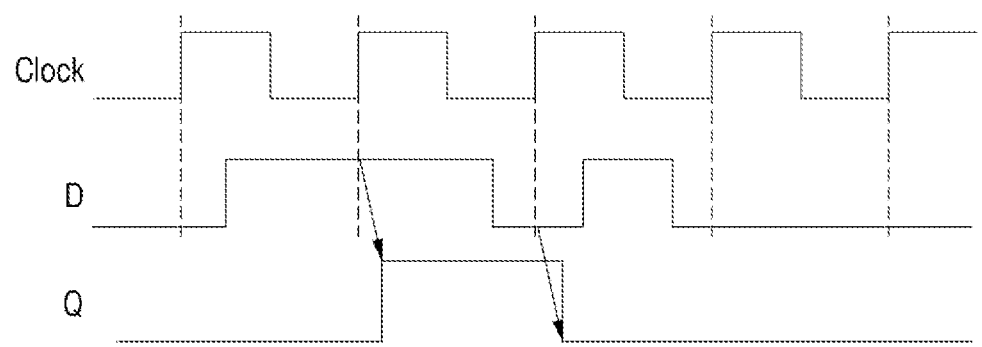

FIGS. 1A and 1B illustrate a flip-flop according to the related art.

FIG. 1A illustrates a flip-flop circuit according to the related art and FIG. 1B illustrates a circuit diagram of a flip-flop according to the related art.

A flip-flop refers to a circuit that may store and maintain 1-bit information and is a basic element in a sequential circuit and is a most essential element when configuring a circuit in a digital system.

FIG. 1A illustrates a flip-flop according to the related art that includes a master latch and a slave latch.

When CLK=0, the flip-flop transfers input data D to the master latch and the slave latch maintains existing data Q (hold mode). When CLK=1, data QM stored in the master latch is transferred to Q and then a current state is maintained (transparent mode).

Referring to FIG. 1B, when CLK is only a rising edge, D received as input data is transferred to output Q. On the contrary, if CLK=0 or CLK=1 is continuously maintained, the output Q remains unchanged.

Hereinafter, terms used in example embodiments of the present invention are described.

The term "static" used in example embodiments of the present invention represents that a pull-down network or a pull-up network operates for all operation cases of the flip-flop.

The pull-down network represents a circuit structure that makes a node voltage become 0 by connecting a specific node to the ground, and the pull-up network represents a circuit structure that makes the node voltage become VDD by connecting the specific node to the VDD.

The term "contention-free" used in example embodiments of the present invention represents a case in which short current does not flow for all operation cases of the flip-flop, that is, VDD and GND are not connected.

The term "redundant transition-free" used in example embodiments of the present invention represents that a transition of flip-flop occurs only when input data in which output of the flip-flop comes differs from Q stored in the slave latch, that is, a power efficient method.

The term "no redundant transistor" used in example embodiments of the present invention represents that a transistor not absolutely necessary for an operation of the flip-flop is eliminated.

Figure 2:
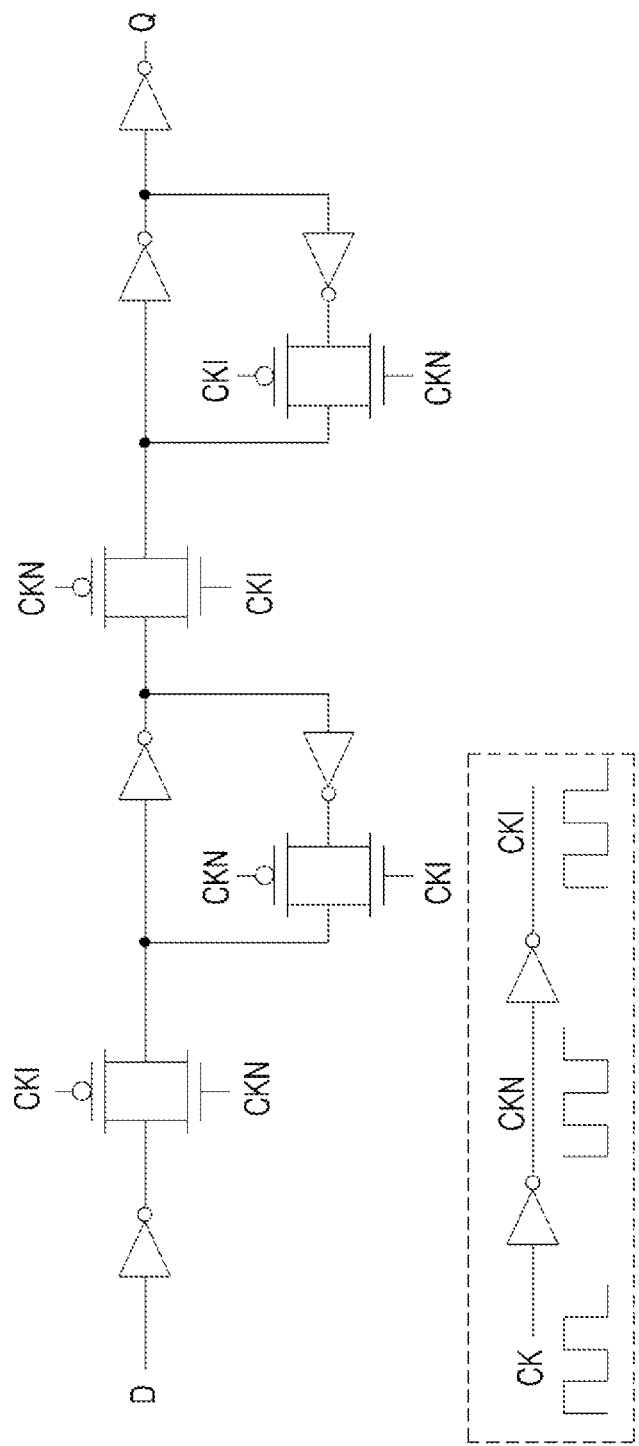
FIG. 2 illustrates a transmission gate flip-flop (TGFF) according to the related art.

FIG. 2 illustrates a transmission gate flip-flop (TGFF) according to the related art.

FIG. 2 illustrates a TGFF, which is an edge trigger flip-flop according to the related art, that includes a master latch and a slave latch.

When CLK=0, the TGFF transfers input data D to the master latch and the slave latch maintains existing data Q (hold mode). When CLK=1, data stored in the master latch is transferred to Q and then a current state is maintained (transparent mode).

In the TGFF, a clock inverter consumes dynamic power every time CLK changes, which leads to increasing total power consumption.

Figure 3:
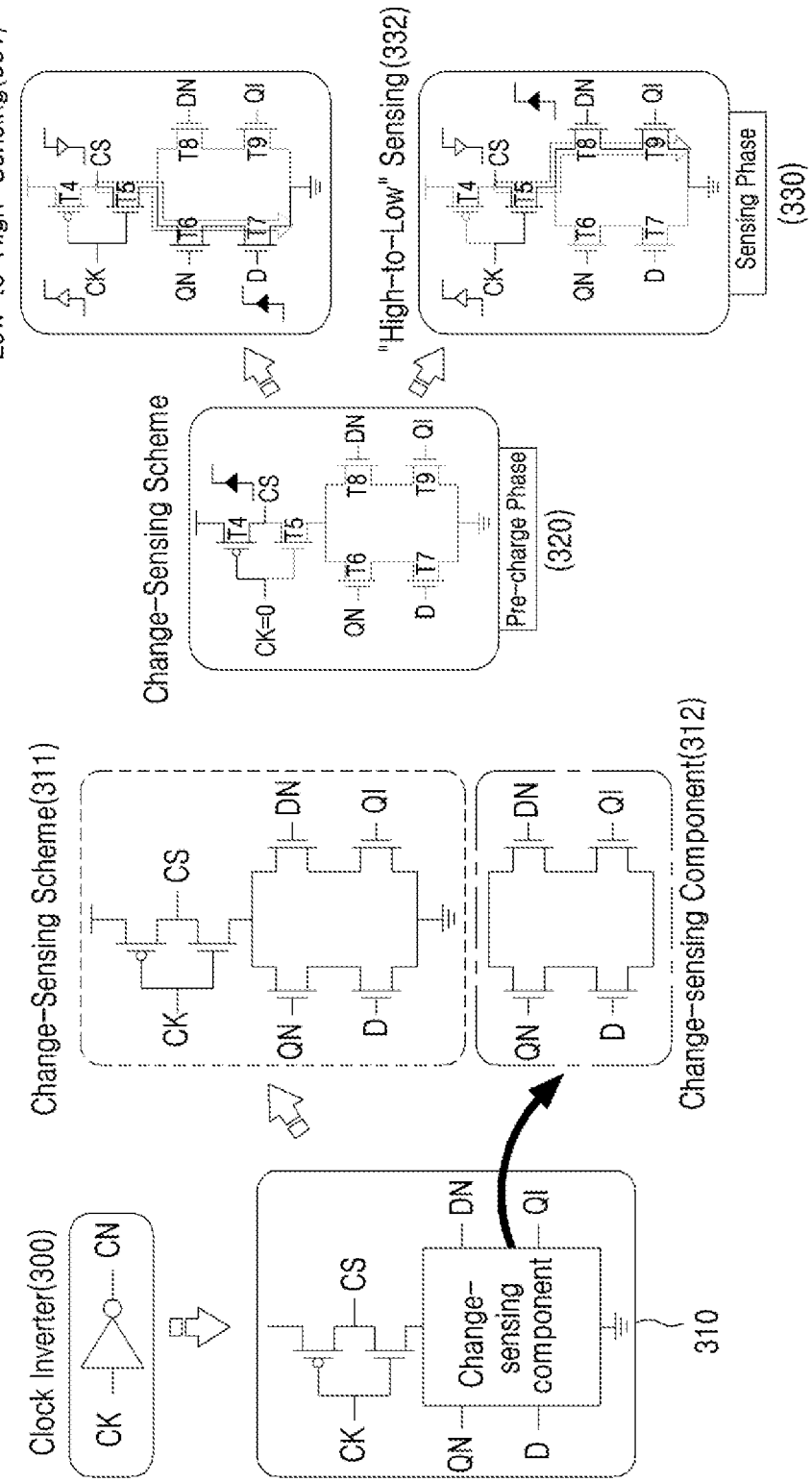
FIG. 3 illustrates a change-sensing operation process according to the related art.

FIG. 3 illustrates a change-sensing operation process according to the related art.

FIG. 3 illustrates a circuit in which an existing clock inverter 300 is replaced with a change-sensing circuit 310. The change-sensing circuit 310 includes a change-sensing component 312, and a detailed change-sensing circuit diagram is the same as reference numeral 311.

Change-sensing includes a pre-charge phase 320 and a sensing phase 330.

The sensing phase 330 includes a sensing process 331 when a clock is low-to-high and a sensing process 332 when the clock is high-to-low.

In the flip-flop, only when input data differs from previously stored data, a clock node (CS) is discharged and a data transition is performed.

Figure 4:
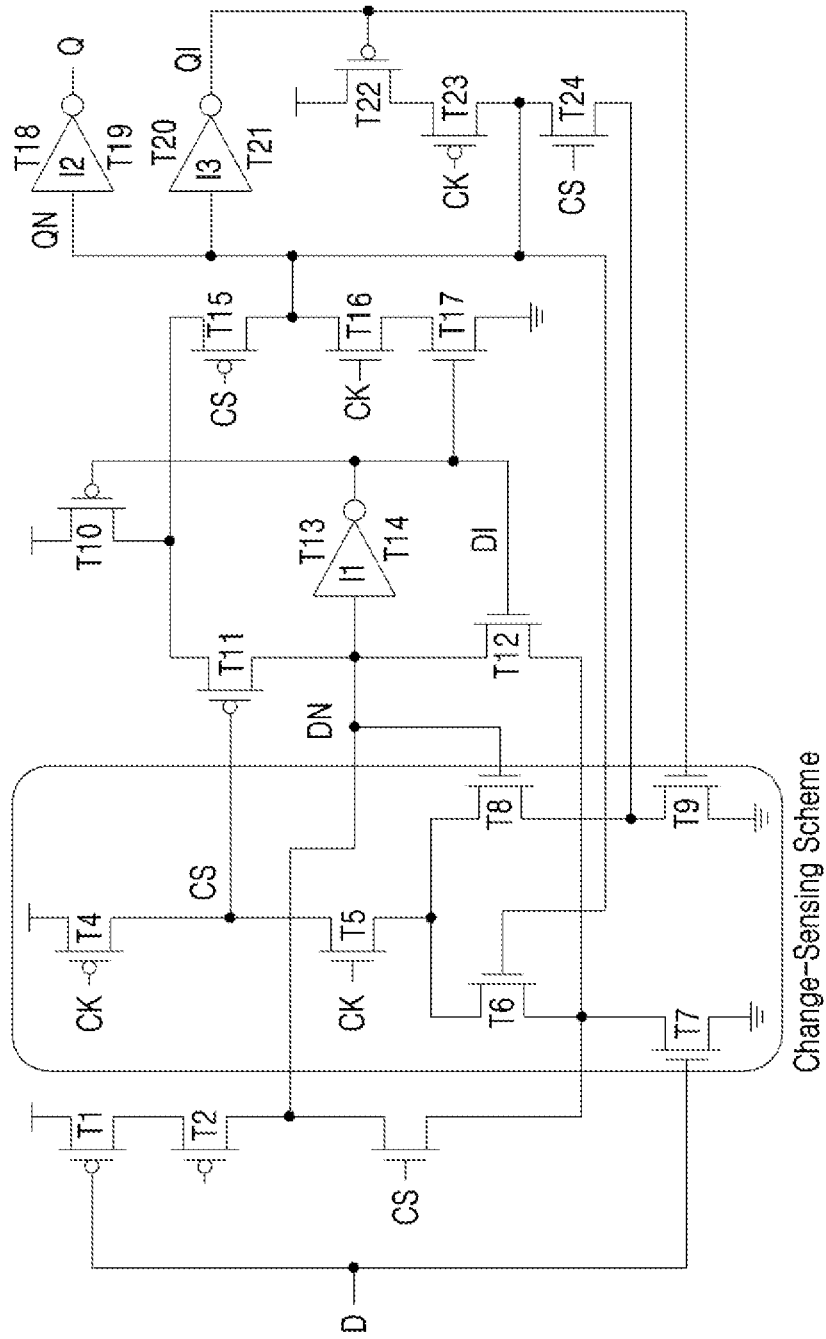
FIG. 4 illustrates a change-sensing flip-flop (CSFF) according to the related art.

FIG. 4 illustrates CSFF according to the related art.

The CSFF may eliminate a redundant clock transition by performing change-sensing by applying the change-sensing circuit of FIG. 3 to the flip-flop in the existing master&slave structure. The CSFF may eliminate a transition unnecessary for an operation of the flip-flop through a change-sensing circuit (change-sensing scheme) operation.

FIGS. 5A to 5D illustrate an operation process of a CSFF according to the related art.

Figure 5A:
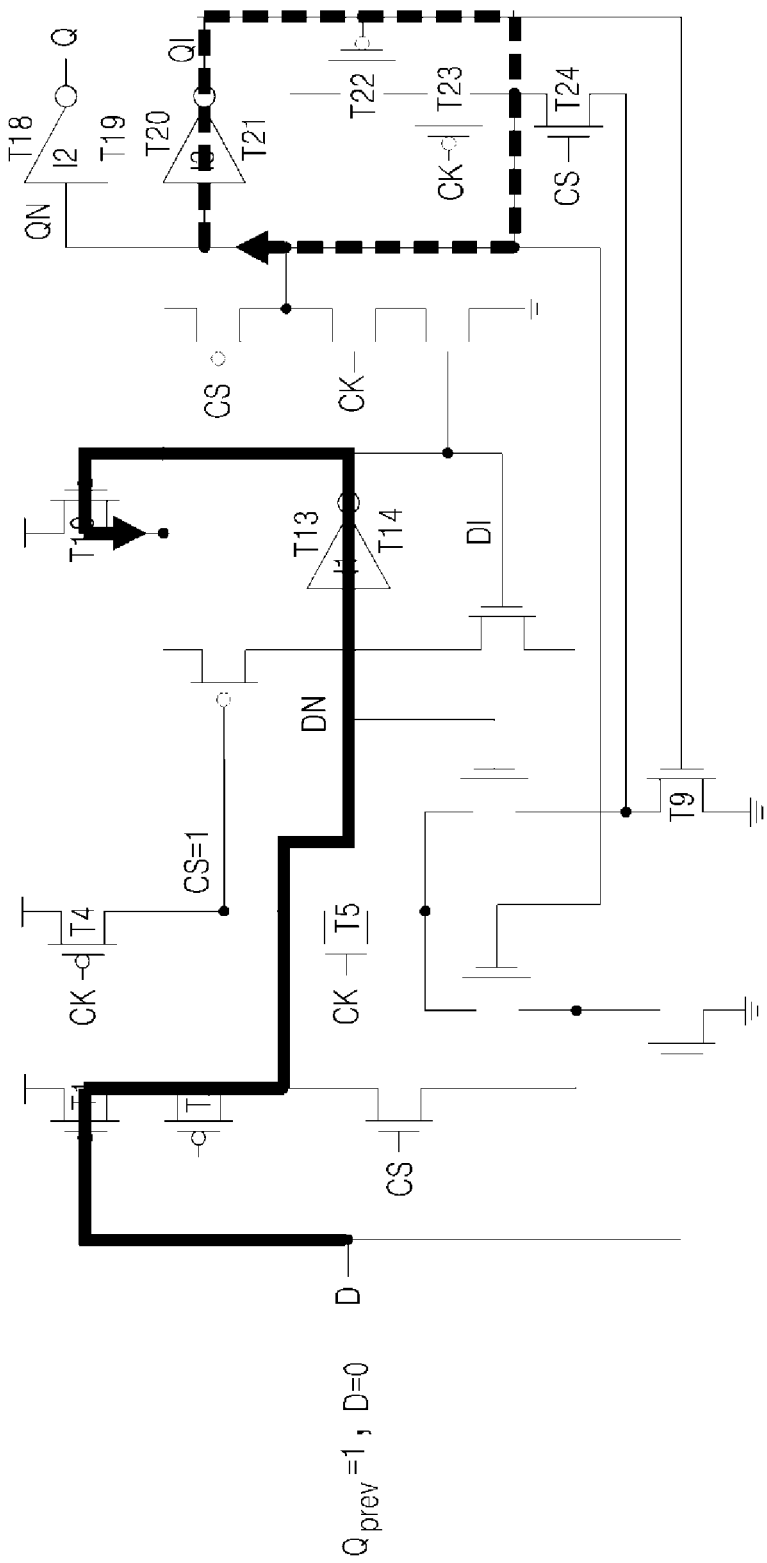
FIGS. 5A to 5D illustrate an operation process of a CSFF according to the related art.

FIG. 5A illustrates a circuit operation process when previous data $Q_{prev}$=1, input data D=0, and CK=0 in the CSFF.

Figure 5B:
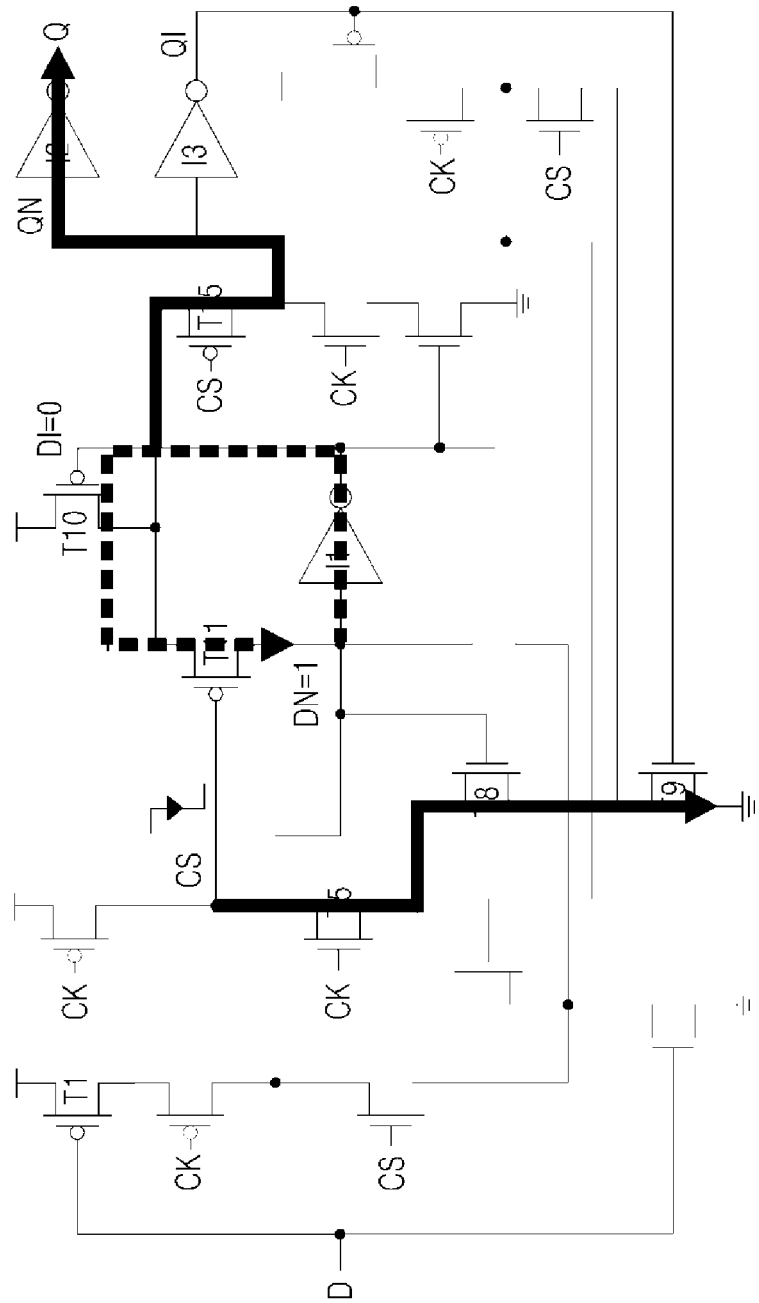

FIG. 5B illustrates a circuit operation process when previous data $Q_{prev}$=1, input data D=0, and CK=1 in the CSFF.

Figure 5C:
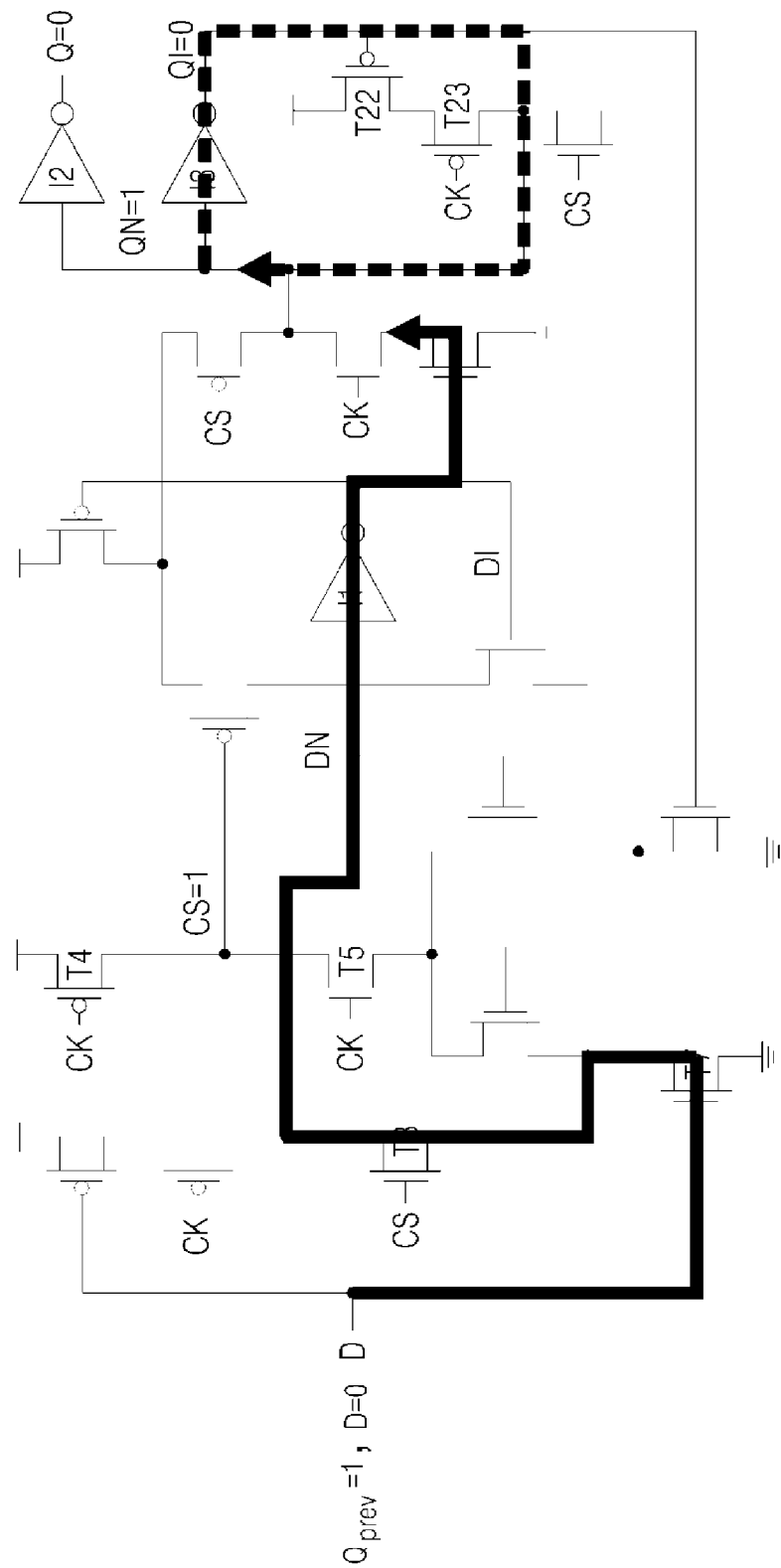

FIG. 5C illustrates a circuit operation process when previous data $Q_{prev}$=0, input data D=1, and CK=0 in the CSFF.

Figure 5D:
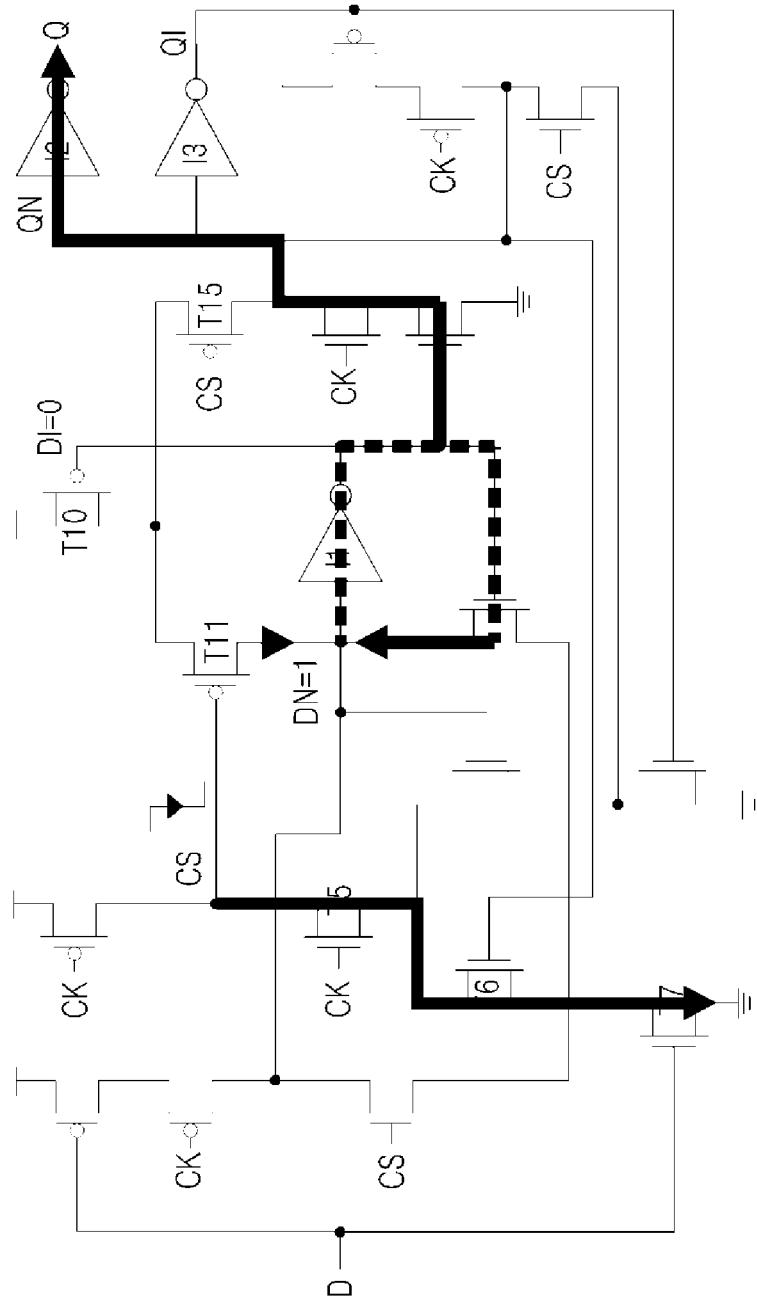

FIG. 5D illustrates a circuit operation process when previous data $Q_{prev}$=0, input data D=1, and CK=1 in the CSFF.

Figure 6:
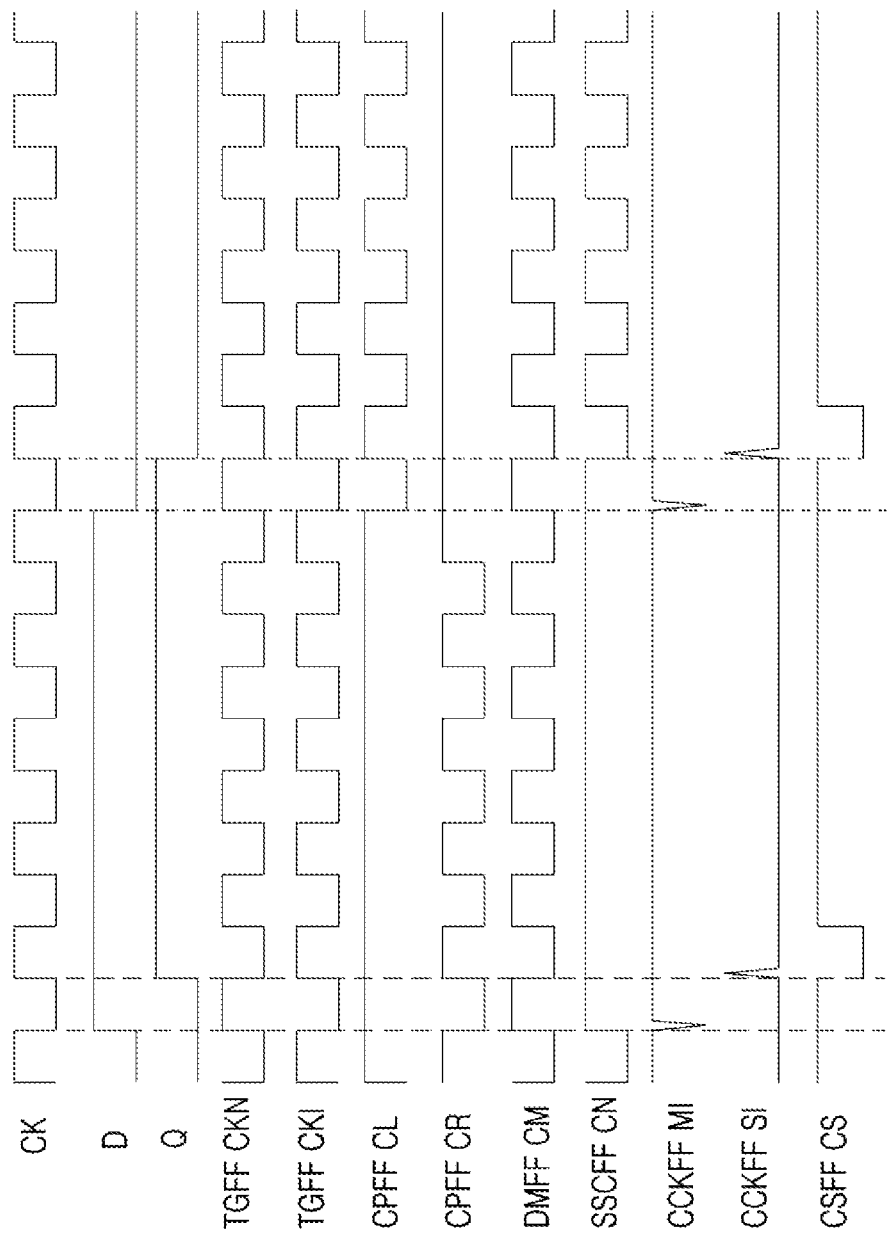
FIG. 6 illustrates a timing diagram for comparing transition of a local clock node according to an example embodiment of the present invention to the related art.

FIG. 6 illustrates a timing diagram for comparing a transition of a local clock node according to an example embodiment of the present invention to the related art.

FIG. 6 is a timing diagram showing a transition of a local clock node in a TGFF, a CPFF, a DMFF, an SSCFF, a CCKFF, and a proposed CSFF.

It can be seen that a transition of a clock node (CS) in the CSFF is much less than that in the TGFF.

Figure 7A:
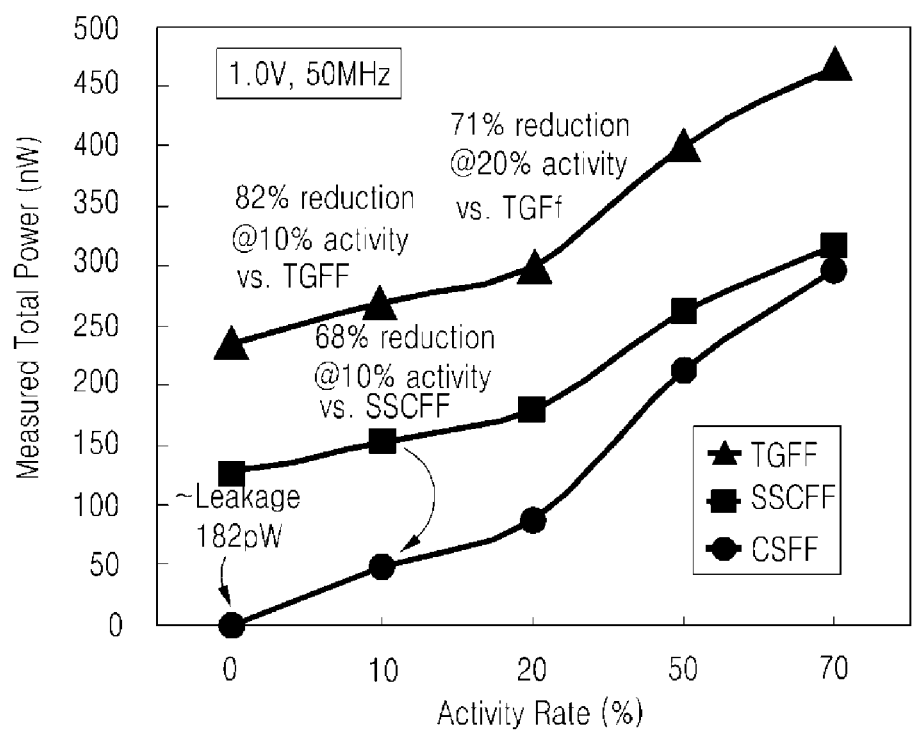
FIGS. 7A and 7B are graphs for comparing total power consumption according to an example embodiment of the present invention to the related art.
Figure 7B:
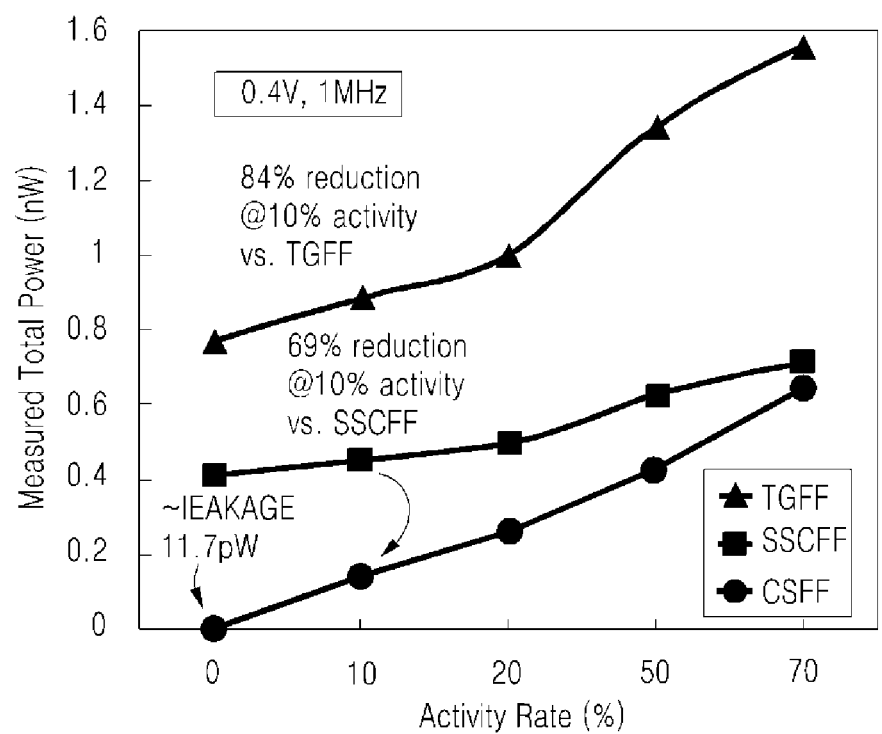

FIGS. 7A and 7B are graphs for comparing total power consumption according to an example embodiment of the present invention to the related art.

FIG. 7A is a graph showing measured total power consumption when VDD=IV and fCK=50 MHz, and FIG. 7B is a graph showing measured total power consumption when VDD=0.4V and fCK=1 MHz.

When comparing power to the conventional TGFF at 10% activity rate indicating how often a data transition is performed during one cycle of clock that is a normalized power measure of a flip-flop, it shows 68% reduction at IV.

Figure 8A:
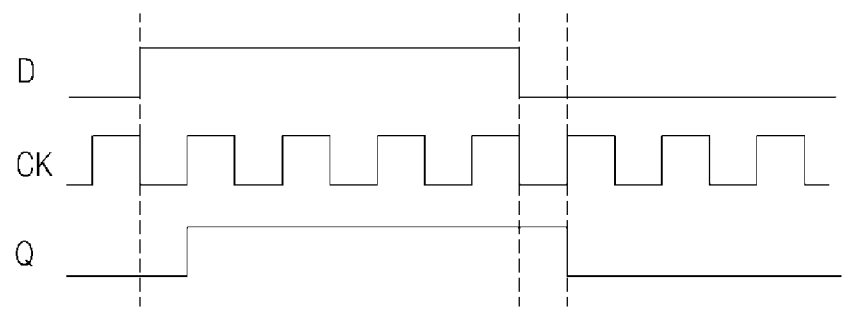
FIGS. 8A and 8B illustrate a flip-flop verification process according to the related art.
Figure 8B:
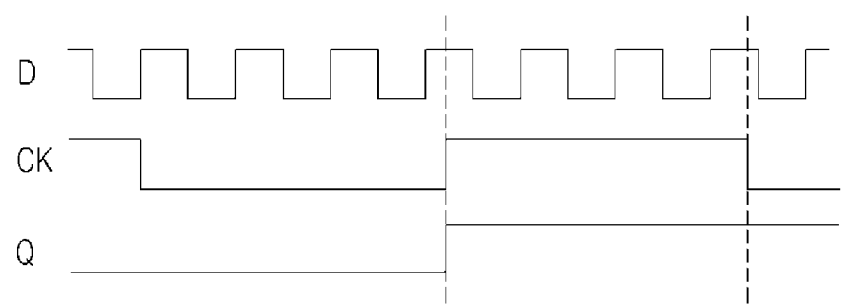

FIGS. 8A and 8B illustrate a flip-flop verification process according to the related art.

Since a flip-flop has a significant impact on power, area, and operating speed of a digital system, a fully static, contention-free, no redundant clock transition, no redundant transistor condition is required as a necessary condition to design the energy efficient and robust flip-flop.

FIG. 8A is a timing diagram when a CK frequency is faster than a frequency of input data D and FIG. 8B is a timing diagram when the frequency of input data D is faster than the CK frequency.

In addition to a case in which the CK frequency is faster than the frequency of input data D, instability of the CSFF according to the related art is present even when the frequency of input data D is faster than the CK frequency.

Recent technologies perform verification under one condition, that is, only when the CK frequency is faster than the frequency of input data D, in a process of verifying a fully static and contention-free characteristic. However, in the case of performing simulation under different condition, that is, when the frequency of input data D is faster than the CK frequency, instability in a flip-flop operation may be discovered. Therefore, there is a need for a flip-flop that meets a necessary condition of flip-flop even when the frequency of input data D is faster than the CK frequency.

Figure 9A:
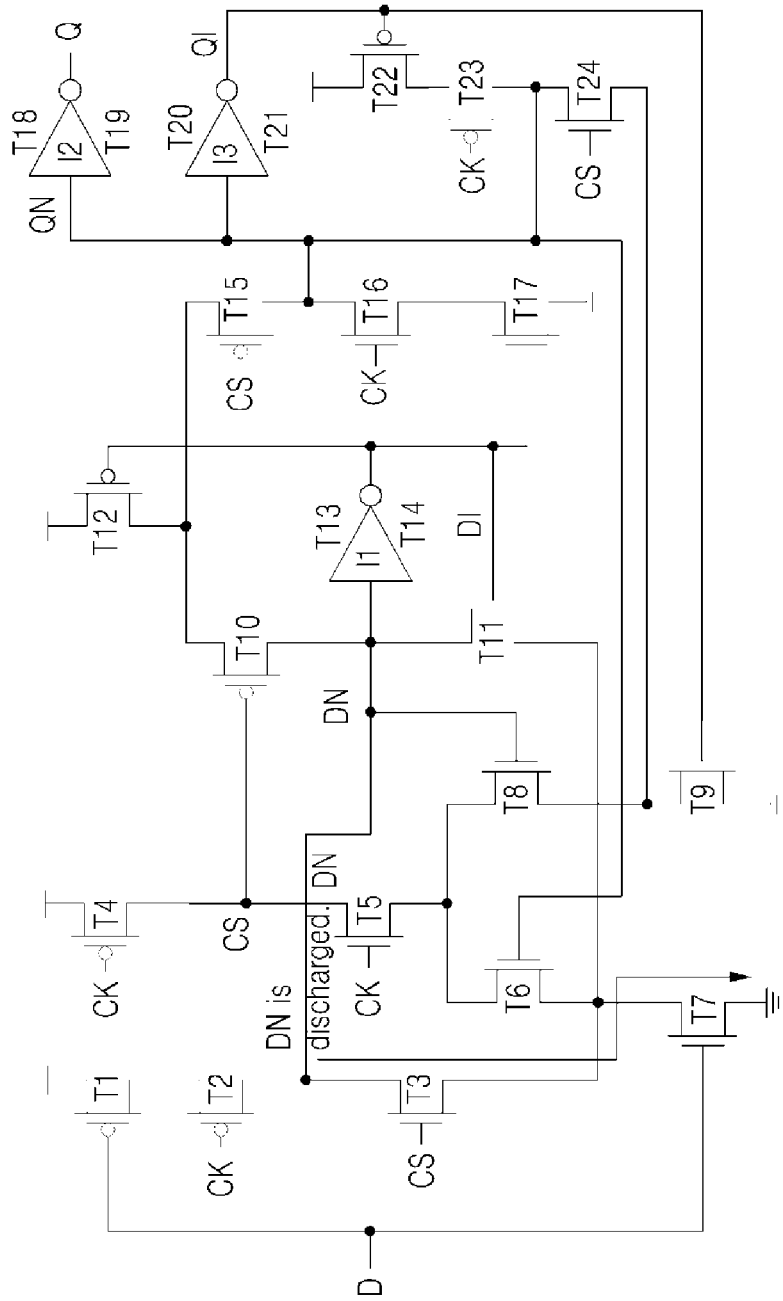
FIGS. 9A and 9B illustrate an issue discovered during a flip-flop verification process according to the related art.
Figure 9B:
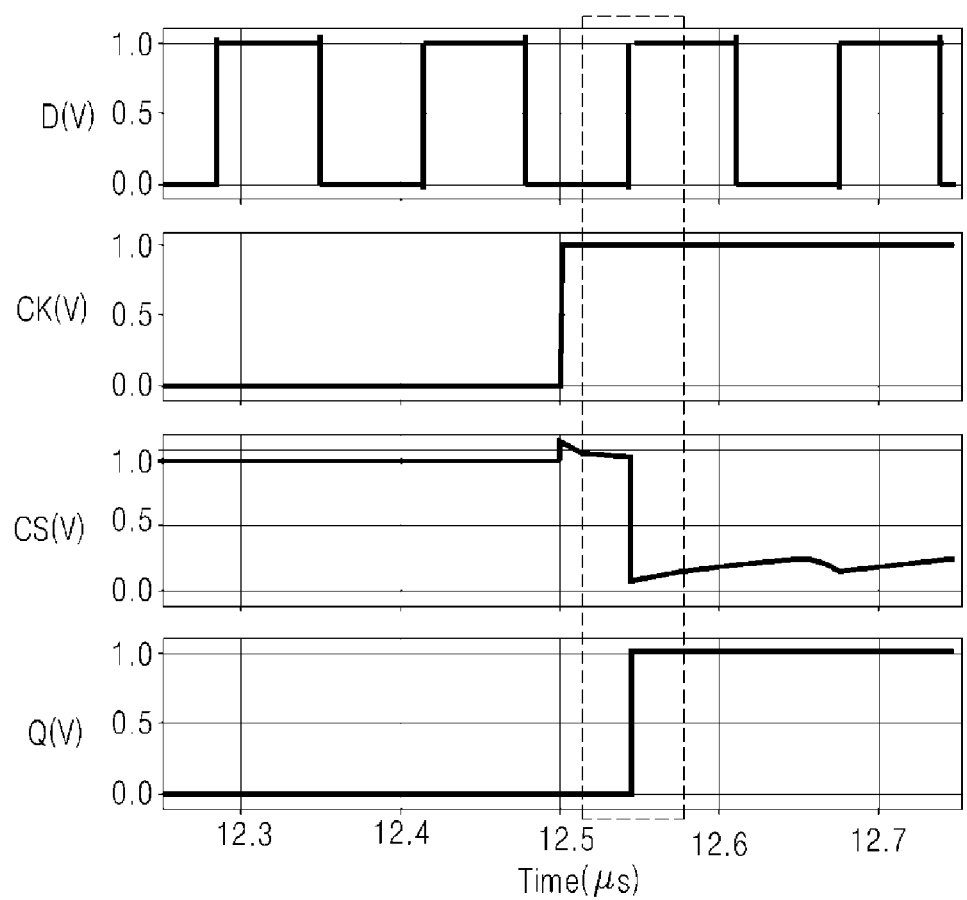

FIGS. 9A and 9B illustrate an issue discovered during a flip-flop verification process according to the related art.

FIG. 9A illustrates a circuit operation in a case in which an issue occurs in a CSFF according to the related art and FIG. 9B illustrates simulation results (D=1 MHZ, CK=230 kHz) at this time.

Referring to FIG. 9A, in a situation in which D=0, CK=1, DN=1, QN=1, and Q=1, CS(=1) is connected to DN(=1) through T3, T6, and T5 and accordingly, maintained as CS=1 for a long time. If D changes from 0 to 1 (0→1) while being maintained CS=1, T3 is also turned ON and a pull-down network operates and accordingly, DN is discharged and wrong data appears as output.

Figure 10A:
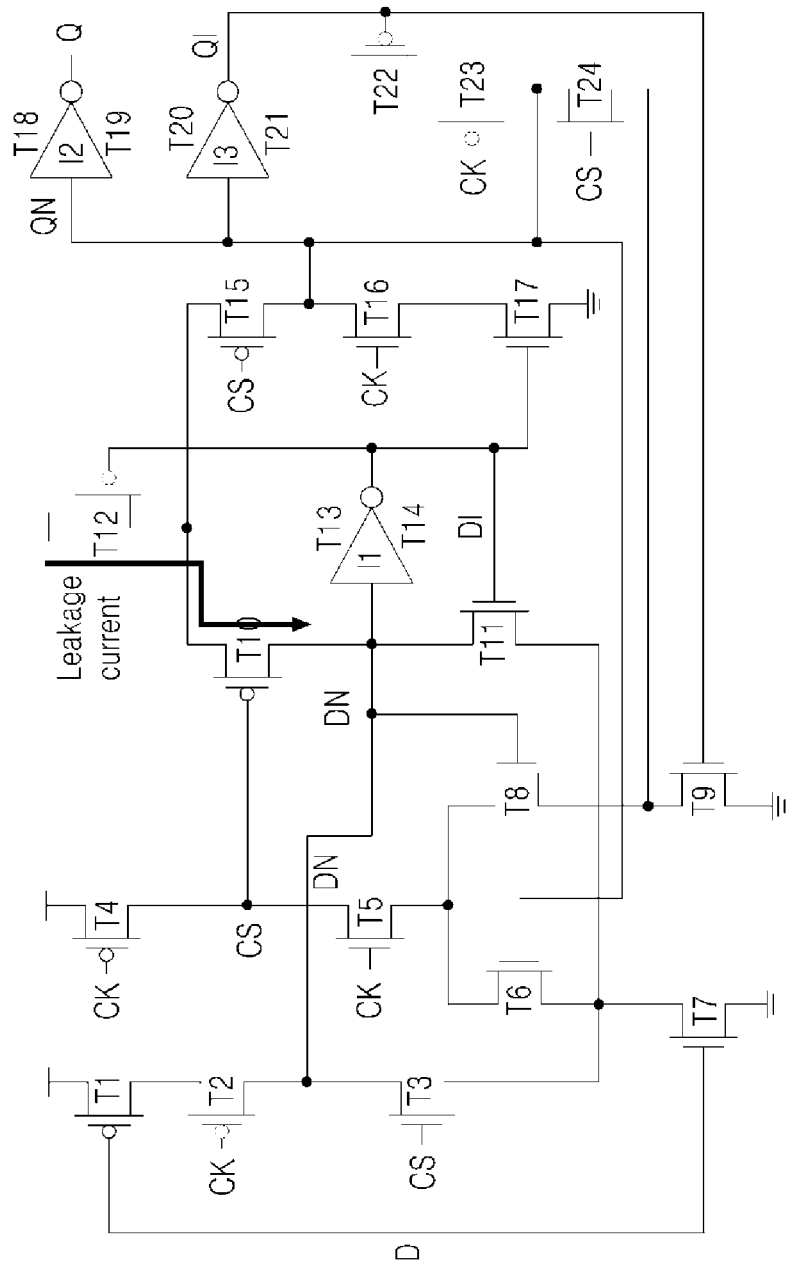
FIGS. 10A and 10B illustrate another issue discovered during a flip-flop verification process according to the related art.
Figure 10B:
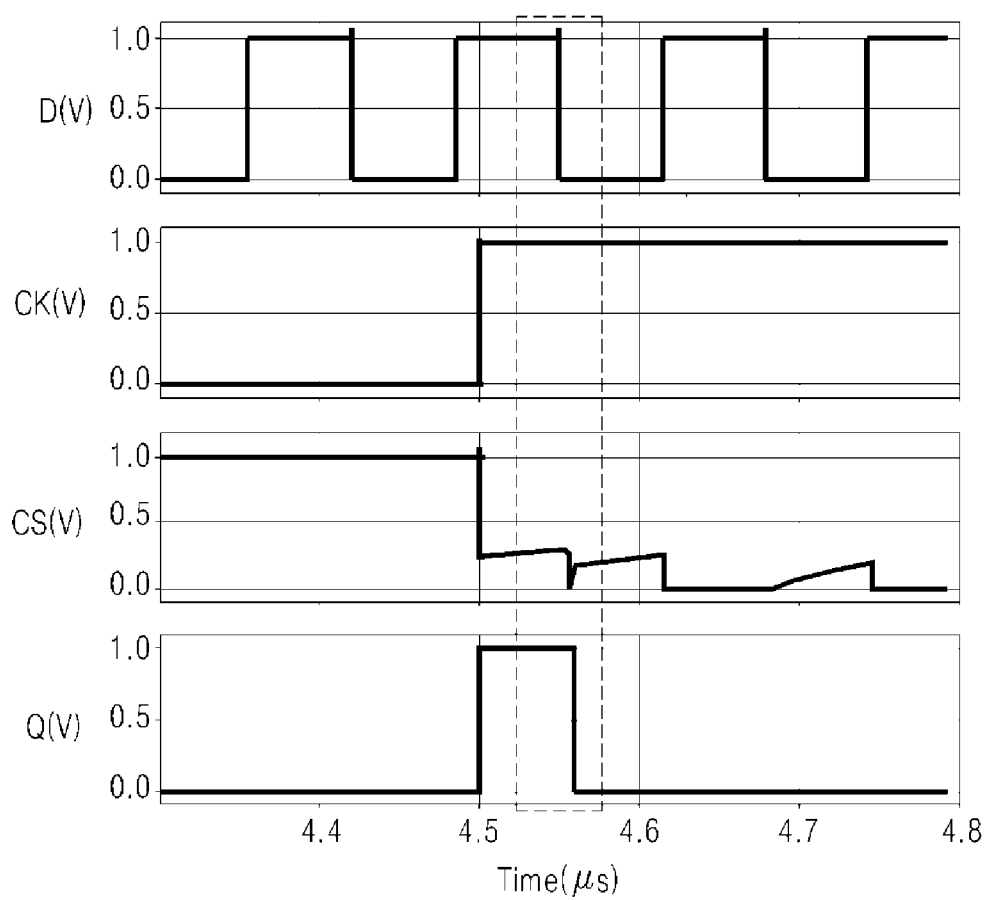

FIGS. 10A and 10B illustrate another issue discovered during a flip-flop verification process according to the related art.

FIG. 10A illustrates a circuit operation in another case in which an issue occurs in a CSFF according to the related art and FIG. 10B illustrates simulation results (D=1 MHZ, CK=230 kHz) at this time.

Referring to FIG. 10A, if D changes from 1 to 0 (1→0) while D=1, CK=1, CS=1, DN=0, QN=0, and Q=1, DN is maintained in a floating state due to absence of a pull-down network (no static). Here, if large leakage current flows in T12, DN is pre-charged and wrong data appears as output. Although large leakage current does not flow, contention occurs in I1 (inverter).

Figure 11:
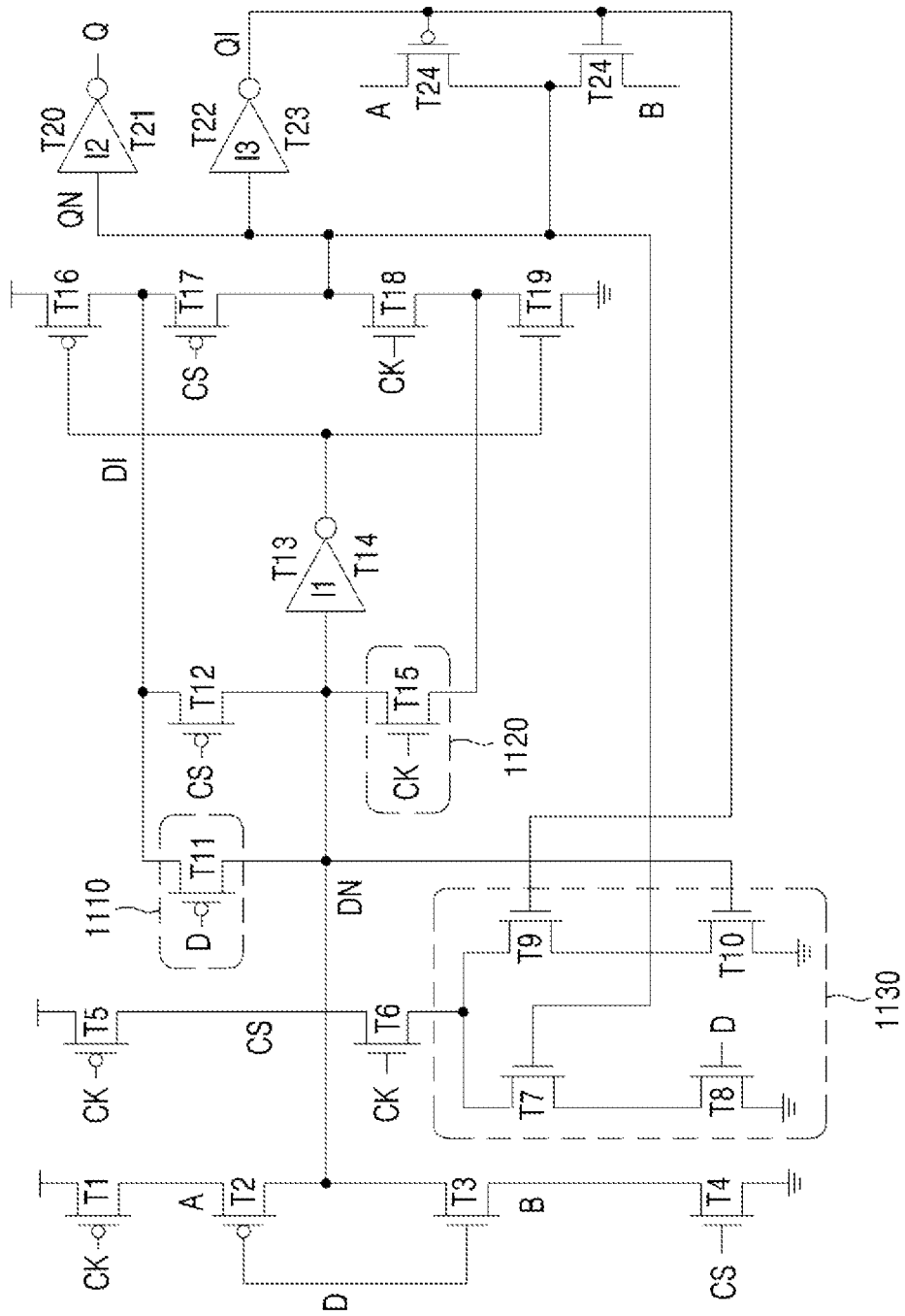
FIG. 11 illustrates a structure of a static change-sensing flip-flop according to an example embodiment of the present invention.

FIG. 11 illustrates a structure of a static change-sensing flip-flop according to an example embodiment of the present invention.

The static change-sensing flip-flop according to an example embodiment includes a pull-up network complementary circuit 1110, a pull-down network complementary circuit 1120, and a change-sensing circuit 1130.

The pull-up network complementary circuit 1110 according to an example embodiment is connected to a discharge node (DN) of a master latch and complements a pull-up network operation while operating according to input data (D).

When input data D=0 and clock CK=1, the pull-up network complementary circuit 1110 according to an example embodiment of the present invention outputs clock node CS=1, down node DN=1, and Q=0.

The pull-down network complementary circuit 1120 according to an example embodiment of the present invention is connected to the discharge node (DN) of the master latch and complements a pull-down network operation while operating according to the clock (CK).

When input data D=0 and clock CK=1, the pull-down network complementary circuit 1120 according to an example embodiment of the present invention outputs clock node CS=0, down node DN=0, and Q=1.

If input data D changes from 1 to 0 (1→0) while input data D=1, clock CK=1, clock node CS=1, down node DN=0, QN=0, and Q=1, the pull-down network complementary circuit 1120 according to an example embodiment of the present invention may solve an issue that the down node DN is maintained in a floating state due to absence of a pull-down network (no static).

Therefore, the pull-down network complementary circuit 1120 according to an example embodiment of the present invention may prevent wrong data from being output as large leakage current flows in T10 and the down node DN is pre-charged.

Also, the pull-down network complementary circuit 1120 according to an example embodiment of the present invention may prevent contention from occurring in I1 (inverter).

The change-sensing circuit 1130 according to an example embodiment of the present invention prevents output of wrong data by the clock node (CS) and the discharge node (DN) in the pull-down network operation of the master latch.

The change-sensing circuit 1130 according to an example embodiment of the present invention may eliminate a redundant clock transition by performing change-sensing using a change detection sensing structure.

The change-sensing circuit 1130 according to an example embodiment of the present invention includes a first stage that includes two transistors (T7 and T8) connected in series and a second stage that includes two transistors (T9 and T10) connected in series.

The transistor (T9) of the second stage uses an output node (QI) as gate input and the transistor (T10) of the second stage uses a master latch node (DN) as gate input.

In the case of the existing CSFF, in a process of eliminating a redundant transistor, a shared transistor is present within a change-sensing circuit, resulting in unnecessary connection with another part. However, the change-sensing circuit 1130 according to an example embodiment of the present invention may prevent an error in an operation of the pull-down network without such unnecessary connection.

In a situation in which input data D=0, clock CK=1, down node DN=1, QN=1, and Q=1, clock node CS=1 is connected to down node DN=1 and accordingly, maintained as CS=1 for a long time. Although input data D changes from 0 to 1 (0→1) while being maintained as CS=1, the pull-down network does not operate and accordingly, wrong data may be prevented from being output.

The static change-sensing flip-flop according to an example embodiment of the present invention exhibits 75.7% reduction at 10% activity rate that is a flip-flop power consumption standard criterion compared to the existing flip-flop and also exhibits 26.2% reduction in leakage power consumption compared to the existing flip-flop. Also, the static change-sensing flip-flop is operable even in a low voltage region and has an improved operating speed compared to the existing flip-flop due to a reduction in C-Q delay. Also, the static change-sensing flip-flop may meet a fully static and contention-free condition that is a condition for robustly operating in a near-threshold voltage (NVT).

FIGS. 12A to 12D illustrate an operation process when there is no data transition of a static change-sensing flip-flop according to an example embodiment of the present invention.

Figure 12A:
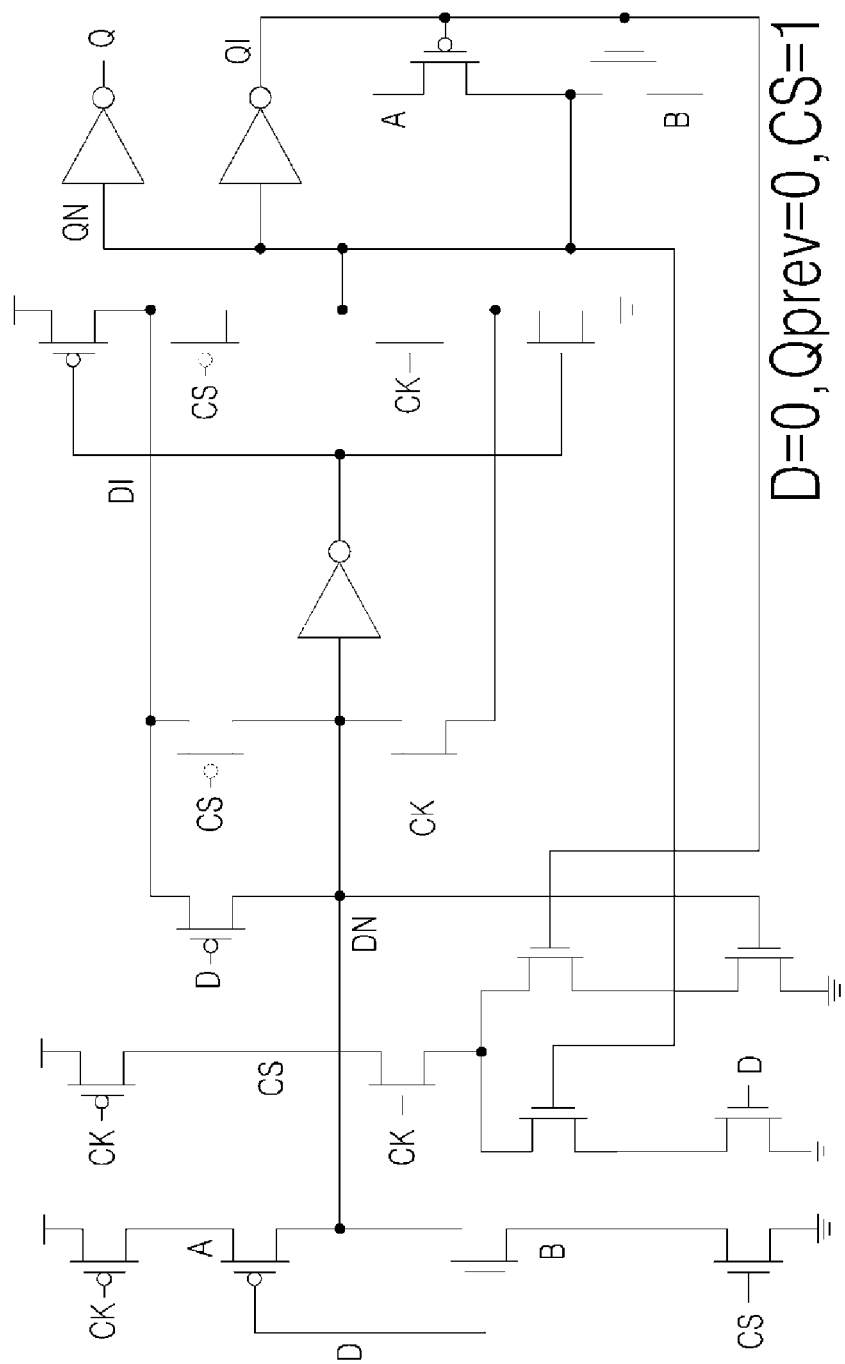
FIGS. 12A to 12D illustrate an operation process when there is no data transition of a static change-sensing flip-flop according to an example embodiment of the present invention.

FIG. 12A illustrates a circuit operation process when input data D=0, previous data $Q_{prev}$=0 (without data transition), and CK=0 in a static change-sensing flip-flop according to an example embodiment of the present invention.

Figure 12B:
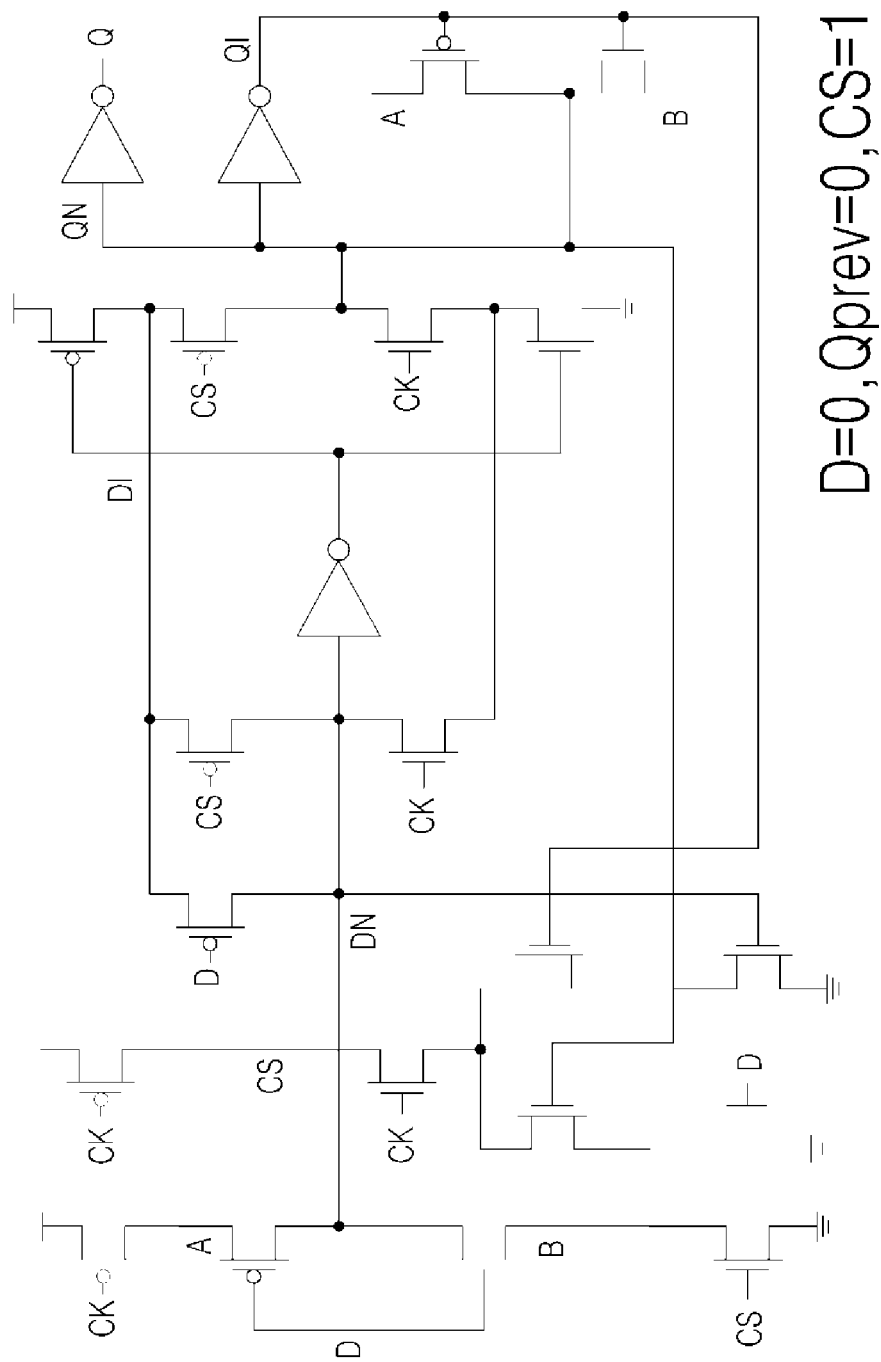

FIG. 12B illustrates a circuit operation process when input data D=0, previous data $Q_{prev}$=0 (without data transition), and CK=1 in a static change-sensing flip-flop according to an example embodiment of the present invention.

Figure 12C:
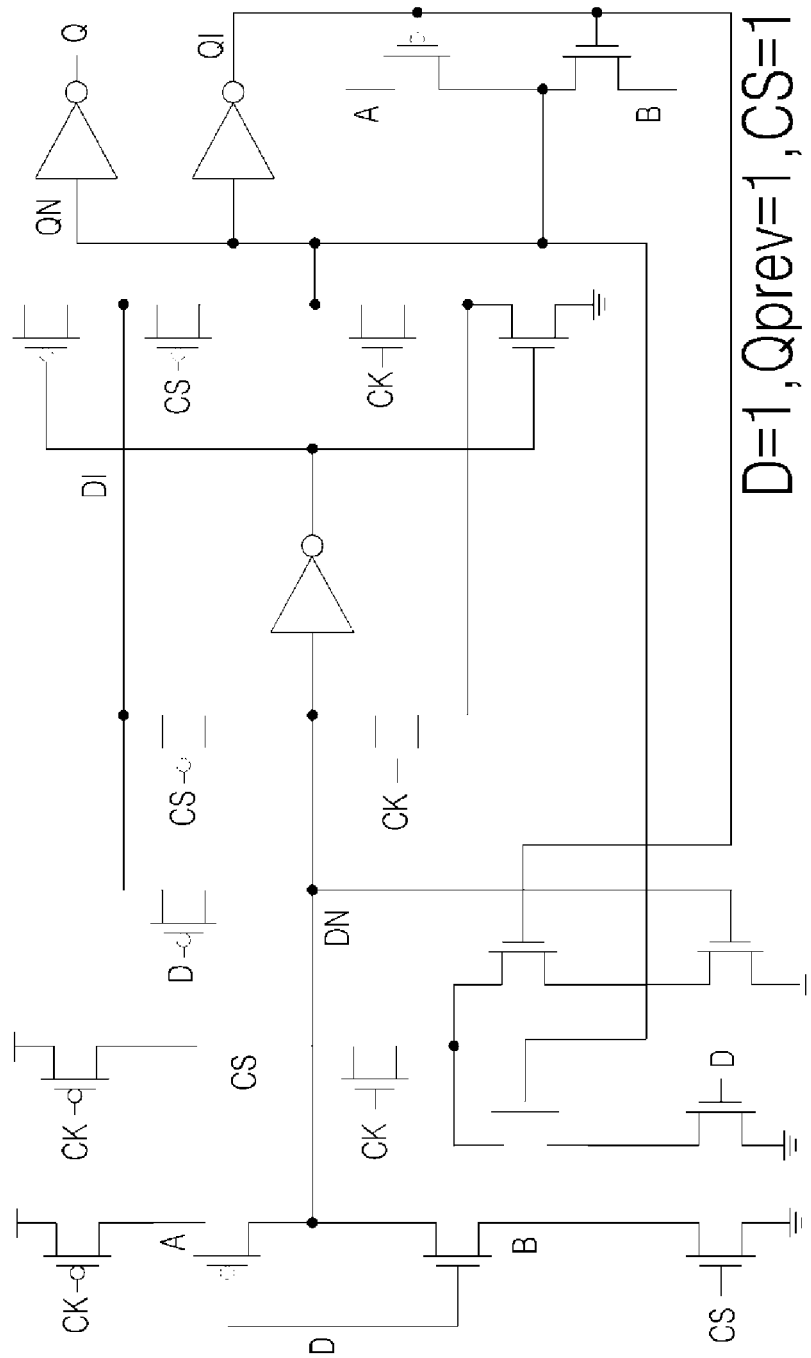

FIG. 12C illustrates a circuit operation process when input data D=1, previous data $Q_{prev}$=1 (without data transition), and CK=0 in a static change-sensing flip-flop according to an example embodiment of the present invention.

Figure 12D:
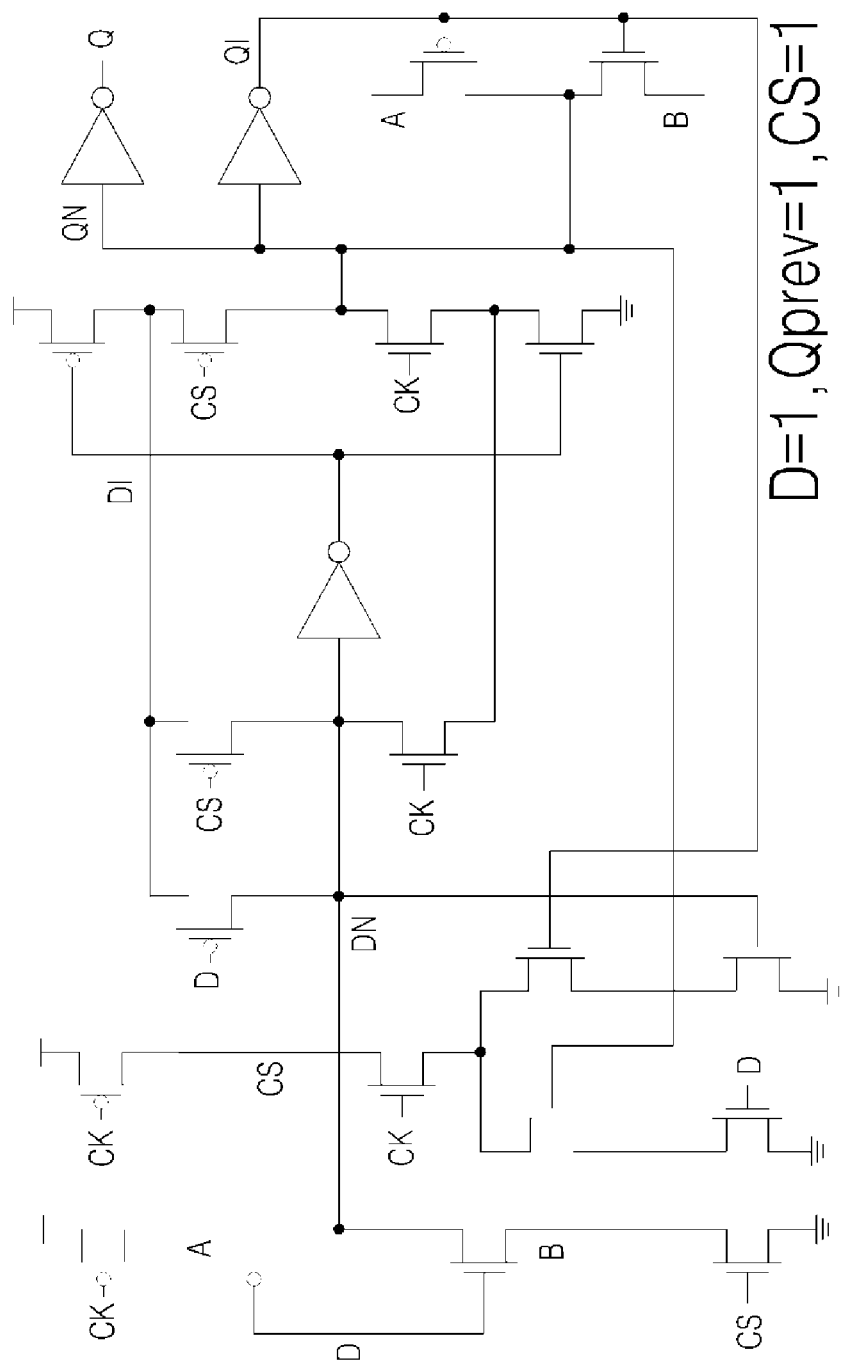

FIG. 12D illustrates a circuit operation process when input data D=1, previous data $Q_{prev}$=1 (without data transition), and CK=1 in a static change-sensing flip-flop according to an example embodiment of the present invention.

It can be seen that the static change-sensing flip-flop according to an example embodiment of the present invention exhibits a fully static and contention-free characteristic for all flip-flop operations when there is no data transition.

FIGS. 13A to 13D illustrate an operation process when there is a data transition of a static change-sensing flip-flop according to an example embodiment of the present invention.

Figure 13A:
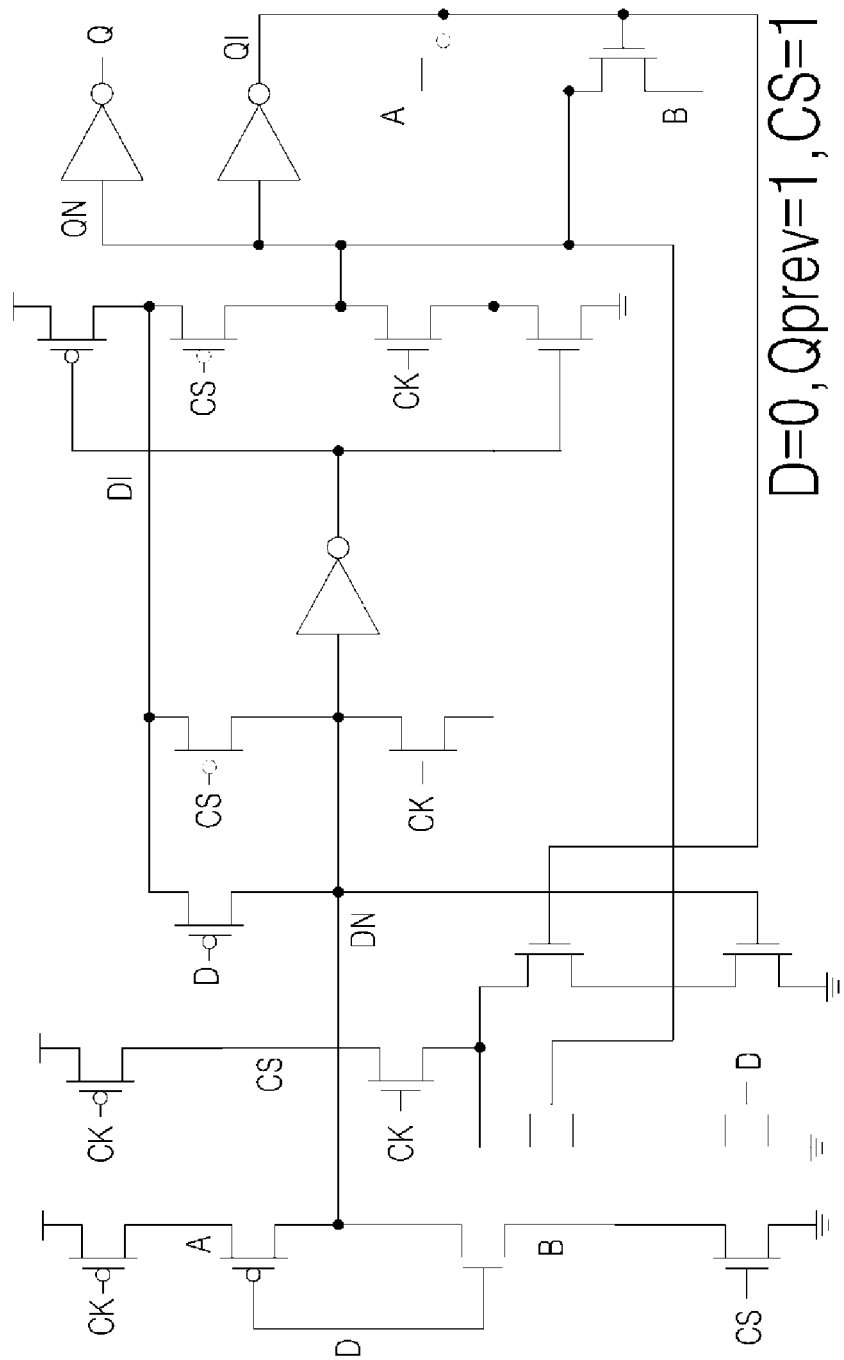
FIGS. 13A to 13D illustrate an operation process when there is a data transition of a static change-sensing flip-flop according to an example embodiment of the present invention.

FIG. 13A illustrates a circuit operation process when input data D=0, previous data $Q_{prev}$=1 (with data transition), and CK=0 in a static change-sensing flip-flop according to an example embodiment of the present invention.

Figure 13B:
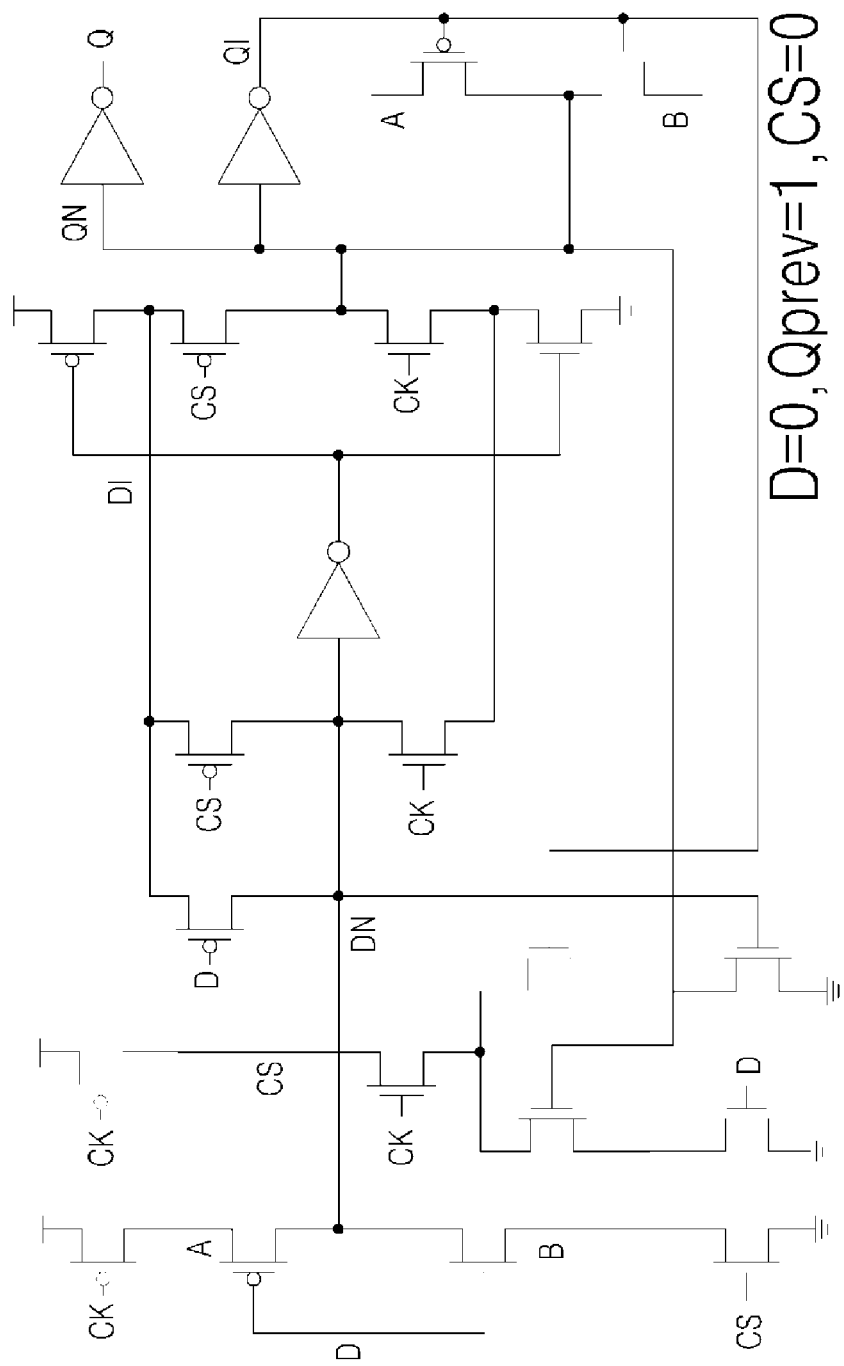

FIG. 13B illustrates a circuit operation process when input data D=0, previous data $Q_{prev}$=1 (with data transition), and CK=1 in a static change-sensing flip-flop according to an example embodiment of the present invention.

Figure 13C:
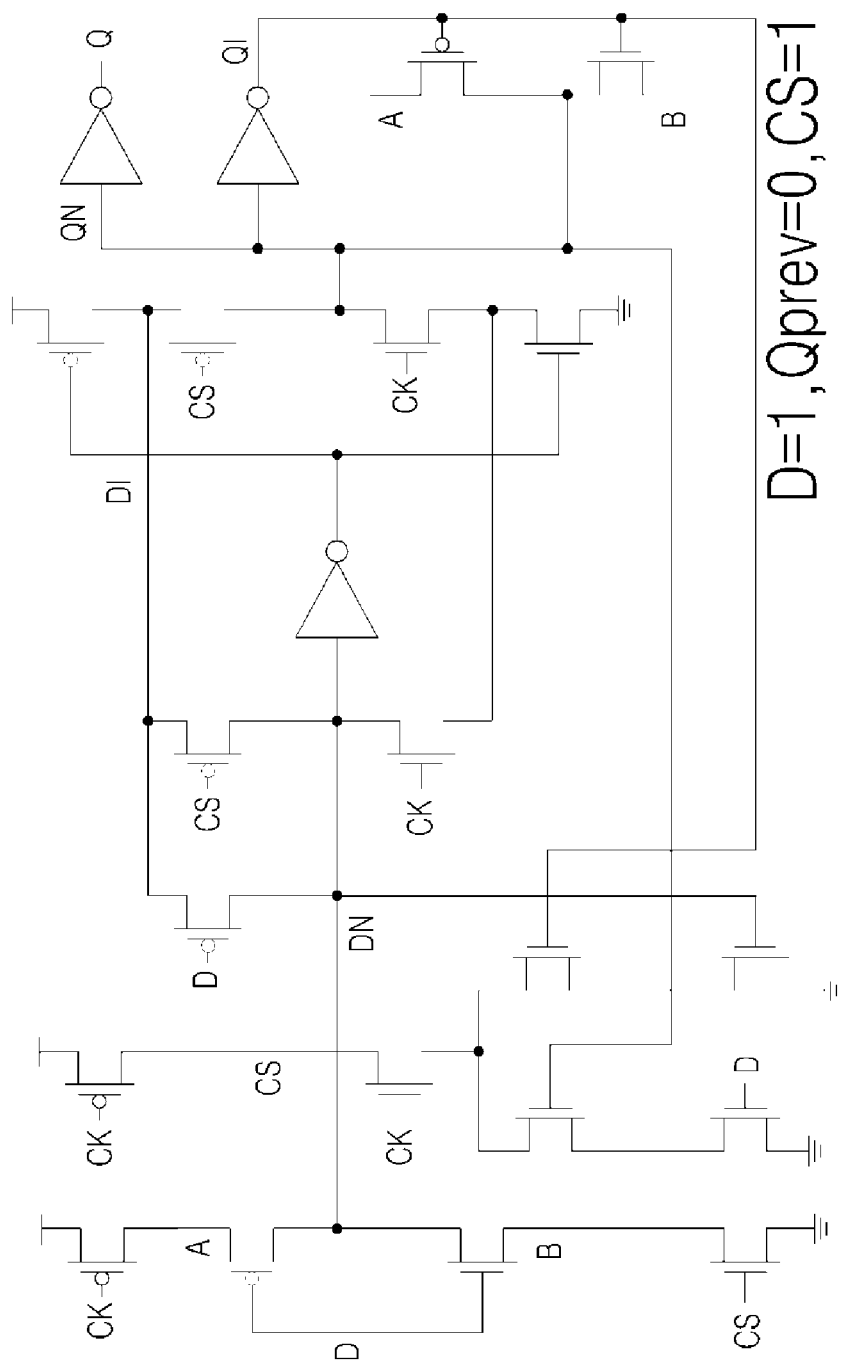

FIG. 13C illustrates a circuit operation process when input data D=1, previous data $Q_{prev}$=0 (with data transition), and CK=0 in a static change-sensing flip-flop according to an example embodiment of the present invention.

Figure 13D:
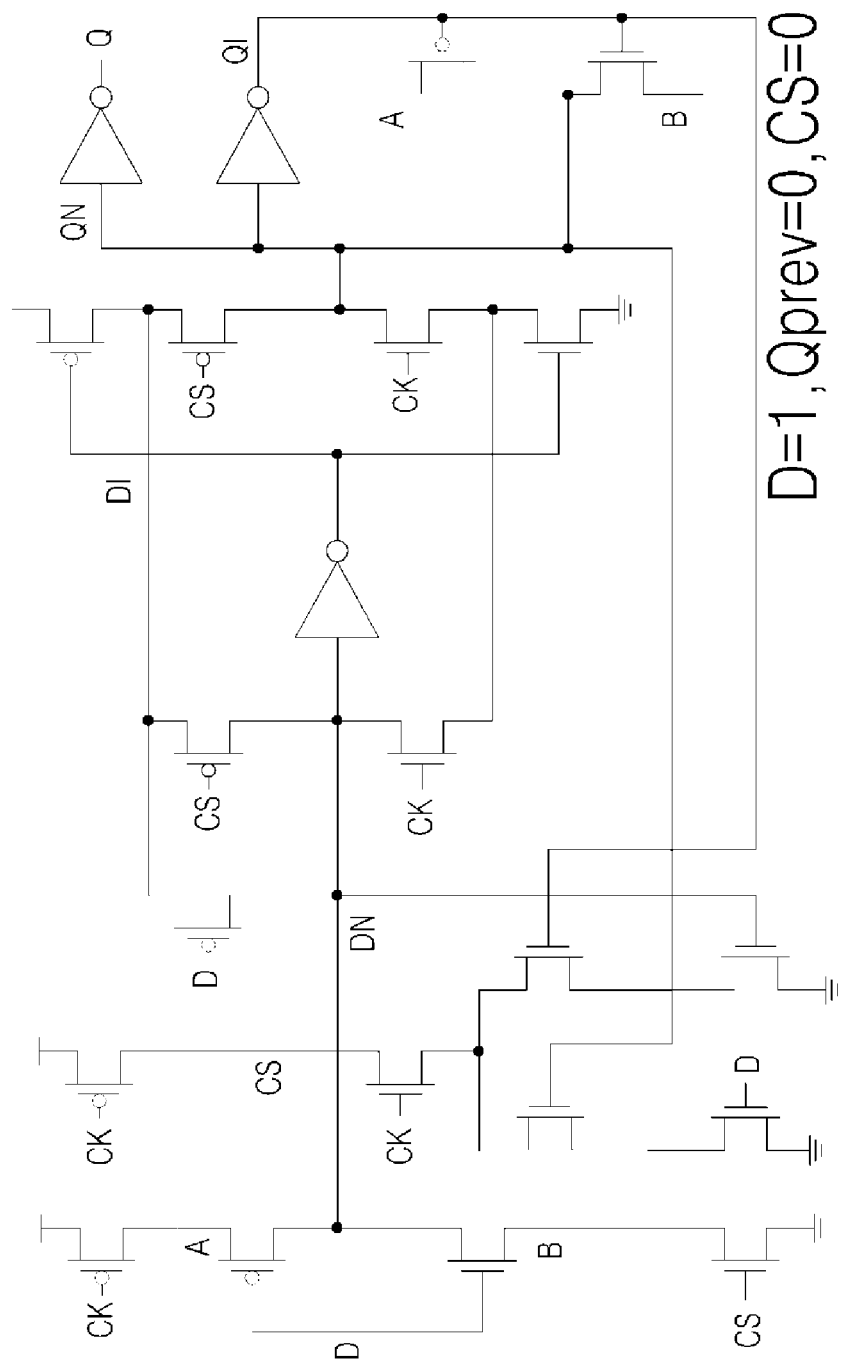

FIG. 13D illustrates a circuit operation process when input data D=1, previous data $Q_{prev}$=0 (with data transition), and CK=1 in a static change-sensing flip-flop according to an example embodiment of the present invention.

It can be seen that the static change-sensing flip-flop according to an example embodiment of the present invention exhibits a fully static and contention-free characteristic for all flip-flop operations when there is data transition.

Figure 14:
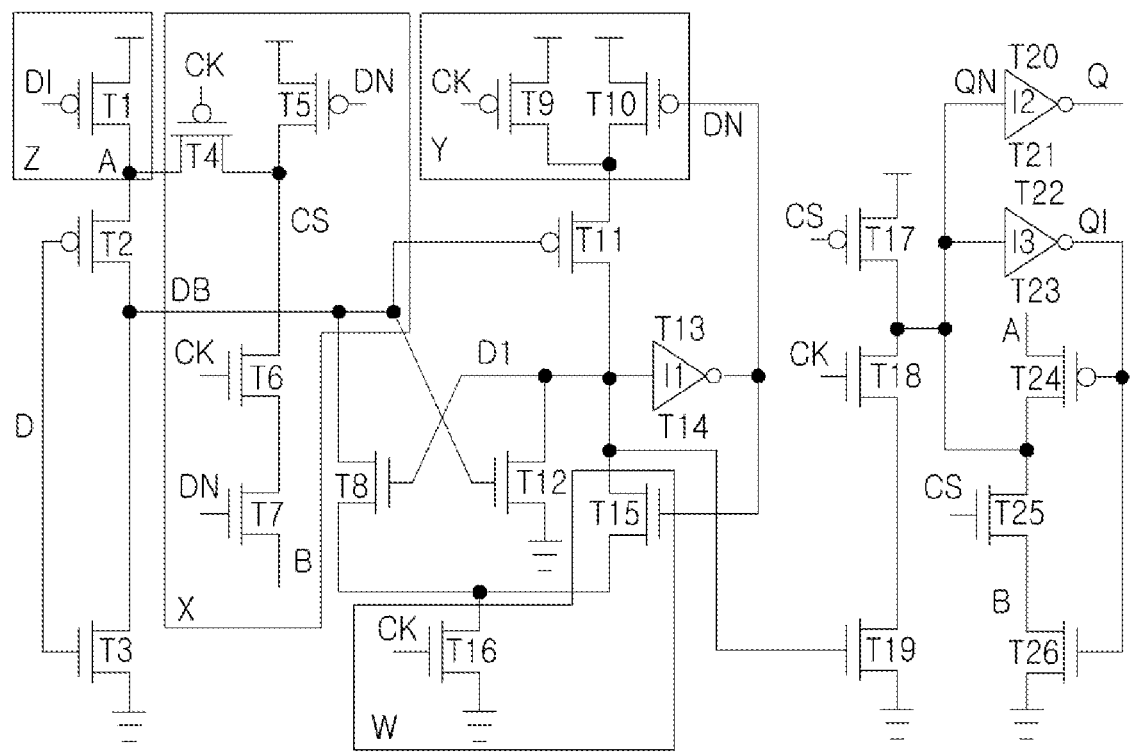
FIG. 14 illustrates a structure of a static change-sensing flip-flop according to another example embodiment of the present invention.

FIG. 14 illustrates a structure of a static change-sensing flip-flop according to another example embodiment of the present invention, and FIGS. 15A to 15D illustrate an operation of a pull-down network complementary circuit and a pull-up network complementary circuit in a static change-sensing flip-flop according to another example embodiment of the present invention.

The static change-sensing flip-flop according to an example embodiment includes a pull-up network complementary circuit 1410, a pull-down network complementary circuit 1420, and a change-sensing circuit 1430.

Figure 15A:
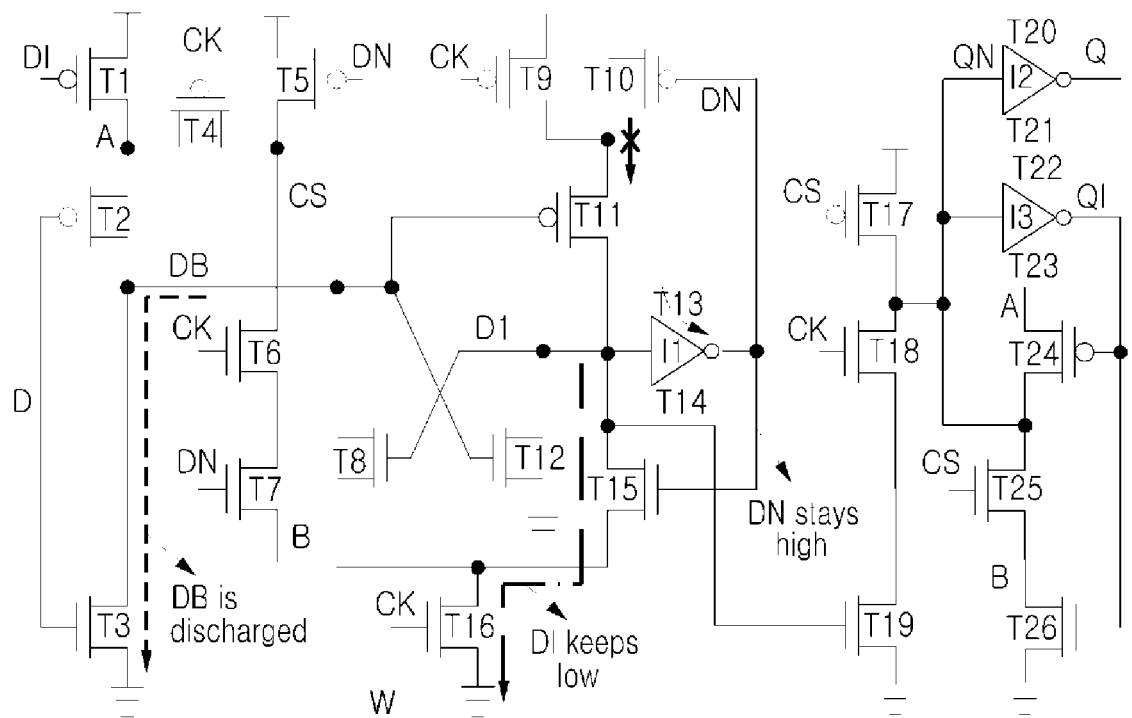
FIGS. 15A to 15D illustrate an operation of a pull-down network complementary circuit and a pull-up network complementary circuit in a static change-sensing flip-flop according to another example embodiment of the present invention.

The pull-up network complementary circuit 1410 according to an example embodiment of the present invention is connected to a discharge node (DN) of a master latch and complements a pull-up network as illustrated in FIG. 15A, while operating according to input data (D).

When input data D=0 and clock CK=1, the pull-up network complementary circuit 1410 according to an example embodiment of the present invention outputs clock node CS=1, down node DN=1, and Q=0.

If input data (D) changes from 0 to 1 while input data (D)=0, clock (CK)=1, clock node (CS)=1, down node (DN)=1, and output data (Q)=1, the pull-up network complementary circuit 1410 according to an example embodiment of the present invention may block the pull-up network.

Figure 15B:
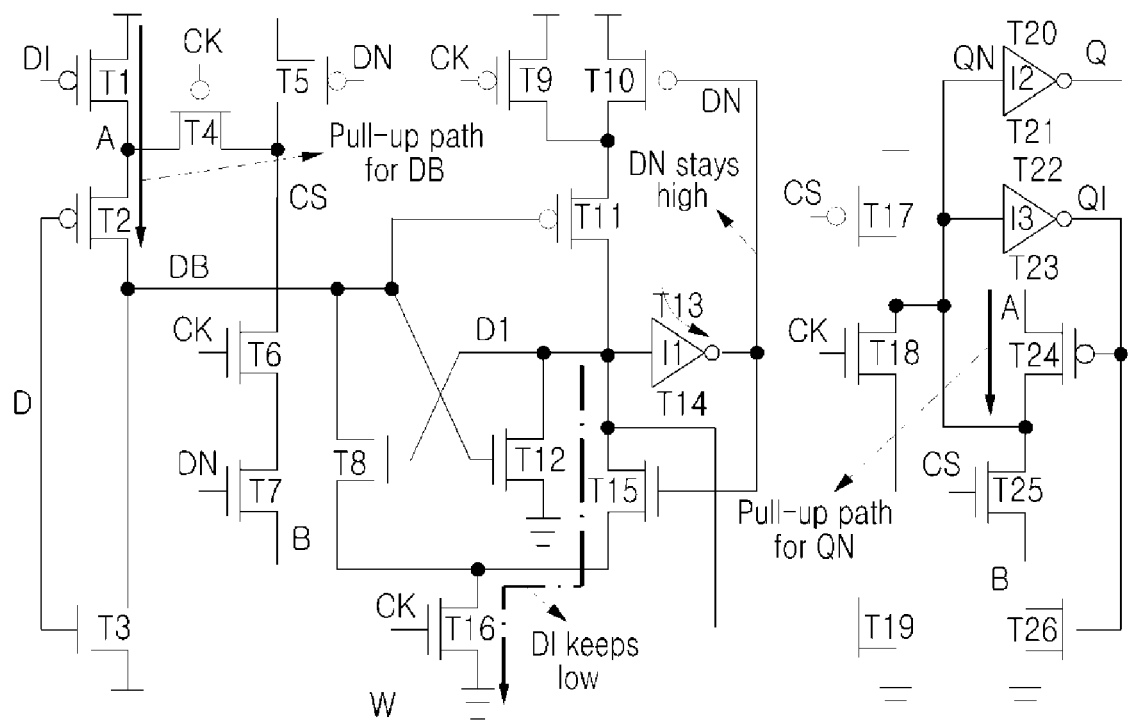
Figure 15C:
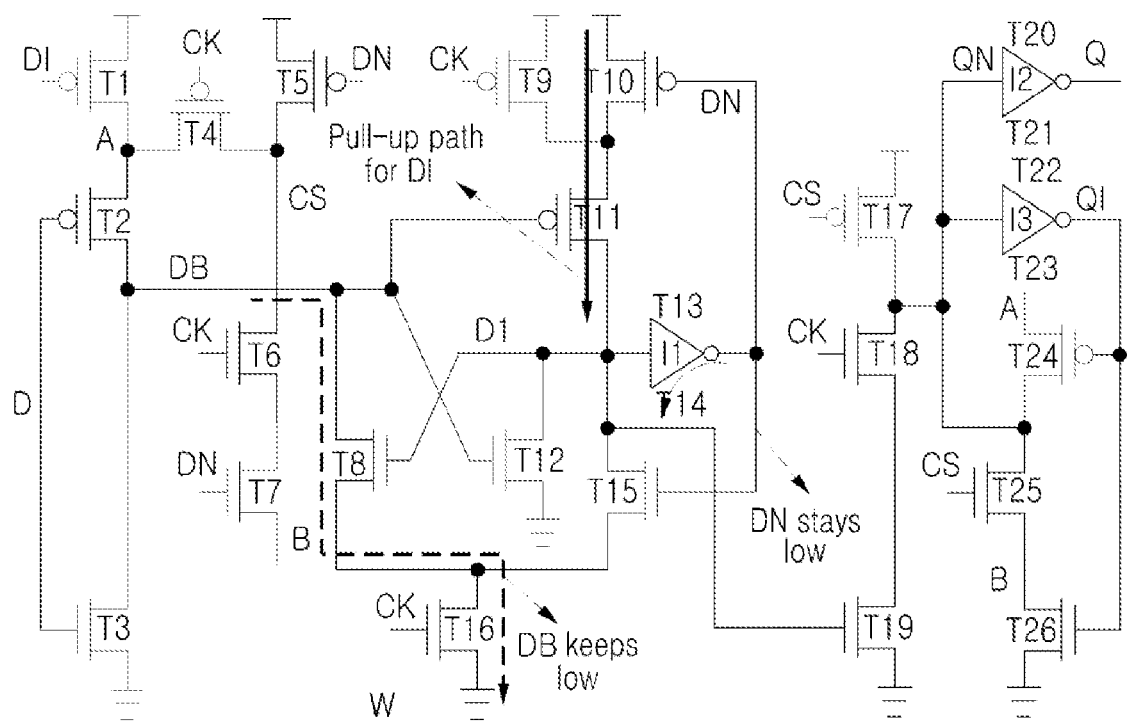

The pull-down network complementary circuit 1420 according to an example embodiment of the present invention is connected to the discharge node (DN) of the master latch and complements a pull-down network operation as illustrated in FIGS. 15B and 15C while operating according to the clock (CK).

When input data D=0 and clock CK=1, the pull-down network complementary circuit 1420 according to an example embodiment of the present invention outputs clock node CS=0, down node DN=0, and Q=1.

If input data D changes from 1 to 0 (1→0) while input data D=1, clock CK=1, clock node CS=1, down node DN=0, QN=0, and Q=1, the pull-down network complementary circuit 1420 according to an example embodiment of the present invention may solve an issue that the down node DN is maintained in a floating state due to absence of a pull-down network (no static).

Therefore, the pull-down network complementary circuit 1420 according to an example embodiment of the present invention may prevent wrong data from being output as large leakage current flows in T10 and the down node DN is pre-charged.

Also, the pull-down network complementary circuit 1420 according to an example embodiment of the present invention may prevent contention from occurring in I1 (inverter).

The change-sensing circuit 1430 according to an example embodiment of the present invention prevents output of wrong data by the clock node (CS) and the discharge node (DN) in the pull-down network operation of the master latch.

The change-sensing circuit 1430 according to an example embodiment of the present invention may eliminate a redundant clock transition by performing change-sensing using a change detection sensing structure.

As illustrated in FIG. 14, the change-sensing circuit 1430 according to an example embodiment of the present invention may include transistors (T4 and T6) that use clock (CK) as gate input and transistors (T5 and T7) that use the down node (DN) as gate input.

In the case of the existing CSFF, in a process of eliminating a redundant transistor, a shared transistor is present within a change-sensing circuit, resulting in unnecessary connection with another part. However, the change-sensing circuit 1430 according to an example embodiment of the present invention may prevent an error in an operation of the pull-down network without such unnecessary connection.

In a situation in which input data D=0, clock CK=1, down node DN=1, QN=1, and Q=1, clock node CS=1 is connected to down node DN=1 and accordingly, maintained as CS=1 for a long time. Although input data D changes from 0 to 1 (0→1) while being maintained as CS=1, the pull-down network does not operate and accordingly, wrong data may be prevented from being output.

For example, in the change-sensing circuit 1430, the clock node (CS) may be maintained high when the clock (CK) is low. Therefore, if new input data (D) triggers a high-to-low transition in output data (Q), the clock node (CS) may be discharged. On the contrary, if the new input data (D) triggers a low-to-high transition in output (Q), the clock node (CS) may stay high since an alternative pull-down path T18 and T19 is activated, which results in a data transition.

Figure 15D:
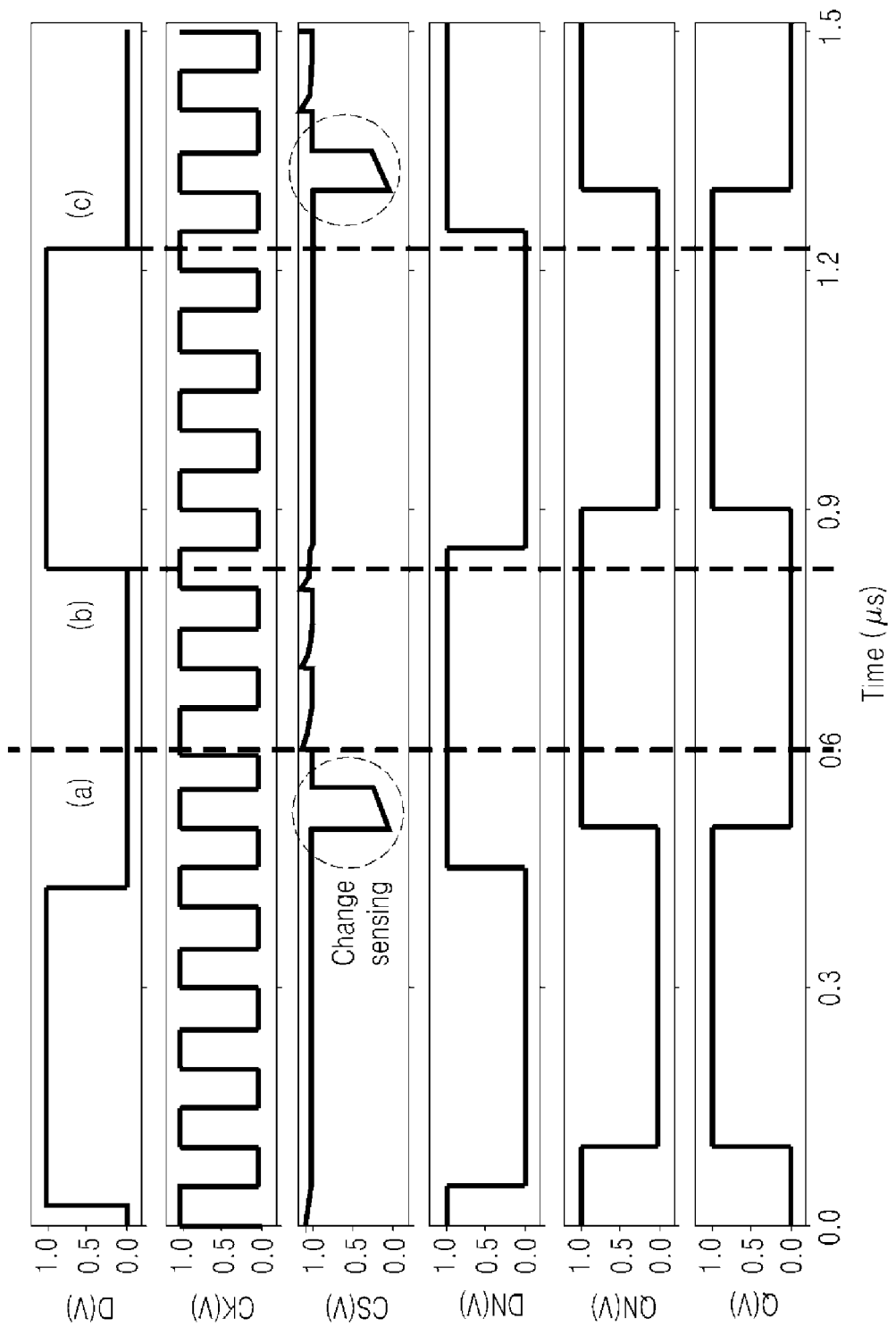

A timing diagram of the static change-sensing flip-flop according to an example embodiment of the present invention is illustrated in FIG. 15D.

The static change-sensing flip-flop according to an example embodiment of the present invention exhibits 75.7% reduction at 10% activity rate that is a flip-flop power consumption standard criterion compared to the existing flip-flop and also exhibits 26.2% reduction in leakage power consumption compared to the existing flip-flop. Also, the static change-sensing flip-flop is operable even in a low voltage region and has an improved operating speed compared to the existing flip-flop due to a reduction in C-Q delay. Also, the static change-sensing flip-flop may meet a fully static and contention-free condition that is a condition for robustly operating in a near-threshold voltage (NVT).

FIGS. 16A to 16D illustrate an operation process when there is no data transition of a static change-sensing flip-flop according to another example embodiment of the present invention.

Figure 16A:
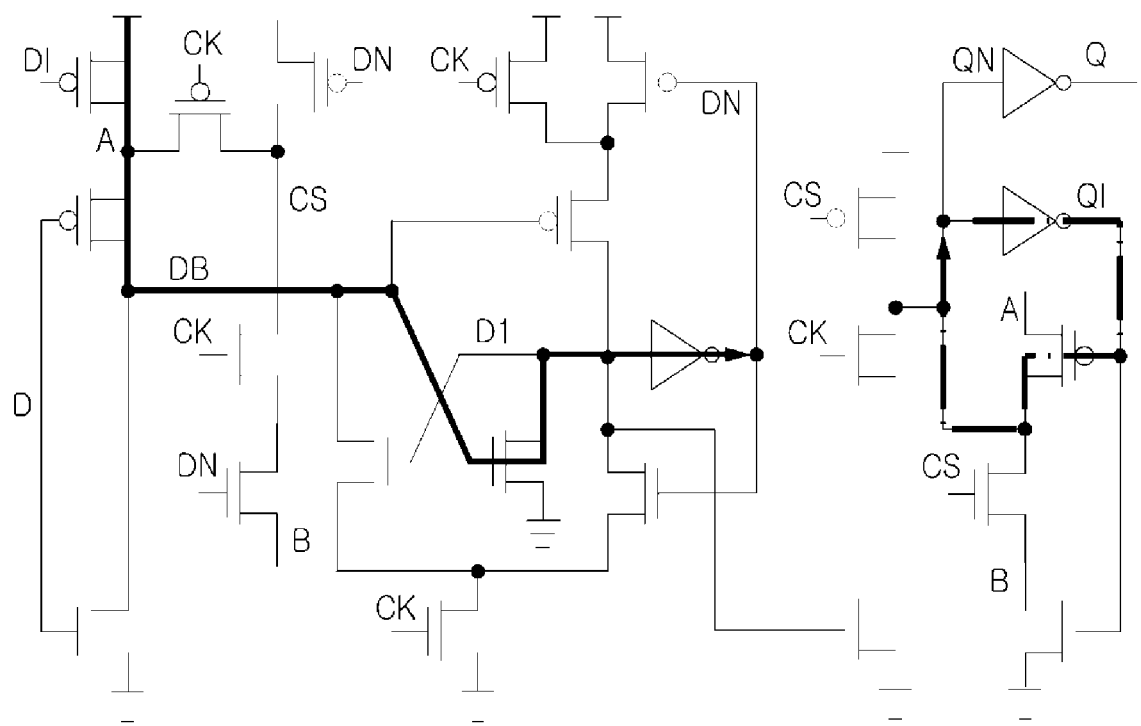
FIGS. 16A to 16D illustrate an operation process when there is no data transition of a static change-sensing flip-flop according to another example embodiment of the present invention.

FIG. 16A illustrates a circuit operation process when input data D=0, previous data $Q_{prev}$=0 (without data transition), and CK=0 in a static change-sensing flip-flop according to an example embodiment of the present invention.

Figure 16B:
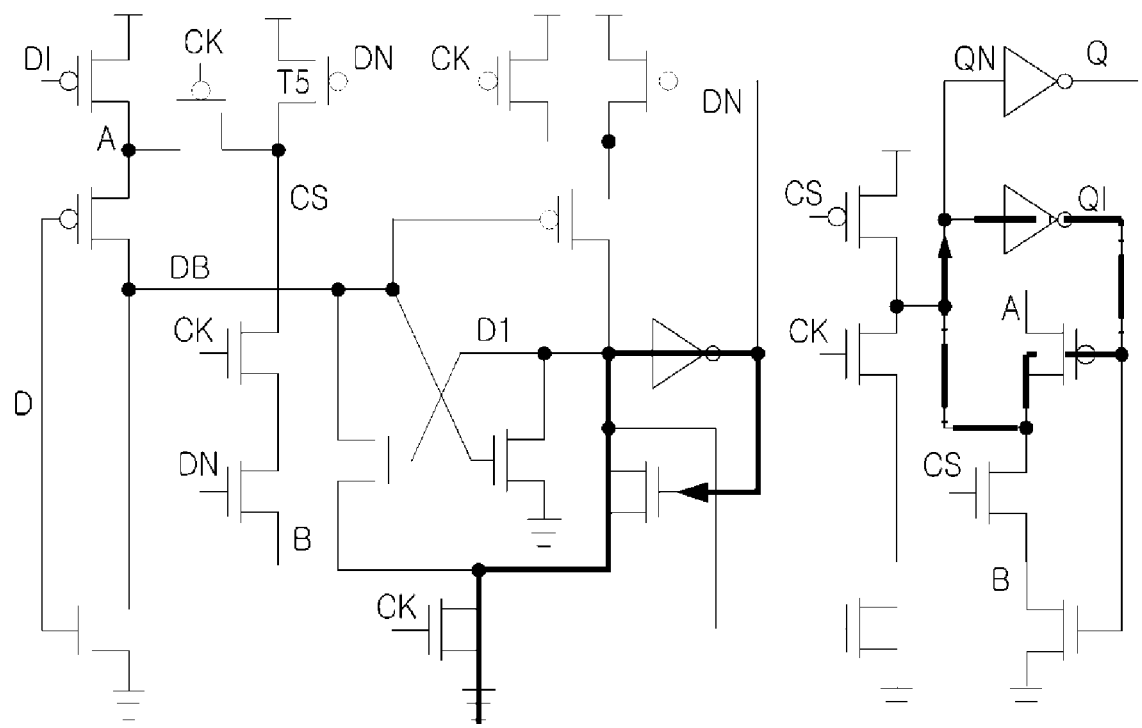

FIG. 16B illustrates a circuit operation process when input data D=0, previous data $Q_{prev}$=0 (without data transition), and CK=1 in a static change-sensing flip-flop according to an example embodiment of the present invention.

Figure 16C:
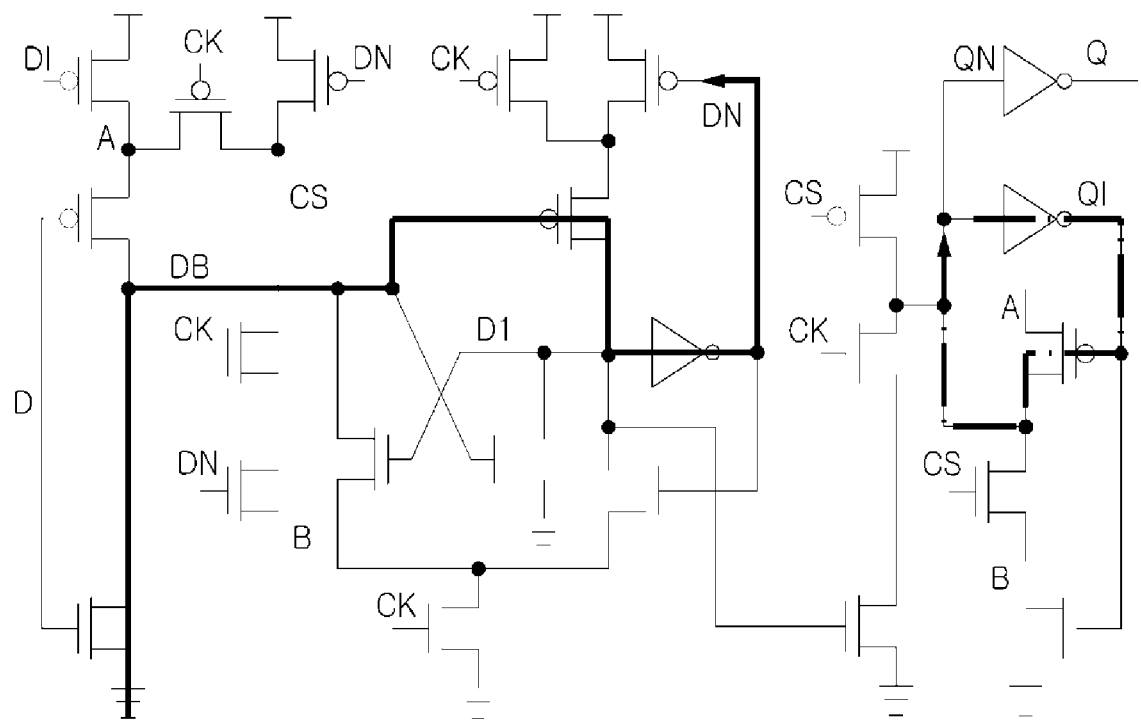

FIG. 16C illustrates a circuit operation process when input data D=1, previous data $Q_{prev}$=1 (without data transition), and CK=0 in a static change-sensing flip-flop according to an example embodiment of the present invention.

Figure 16D:
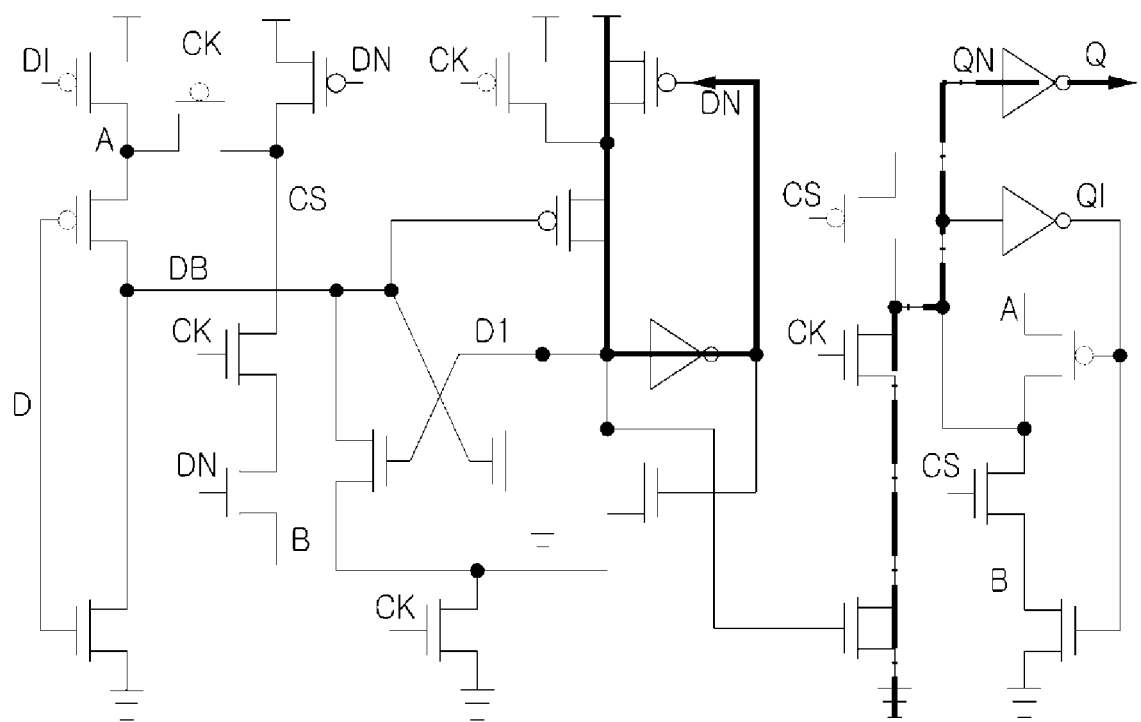

FIG. 16D illustrates a circuit operation process when input data D=1, previous data $Q_{prev}$=1 (without data transition), and CK=1 in a static change-sensing flip-flop according to an example embodiment of the present invention.

It can be seen that the static change-sensing flip-flop according to an example embodiment of the present invention exhibits a fully static and contention-free characteristic for all flip-flop operations when there is no data transition.

FIGS. 17A to 17D illustrate an operation process when there is a data transition of a static change-sensing flip-flop according to another example embodiment of the present invention.

Figure 17A:
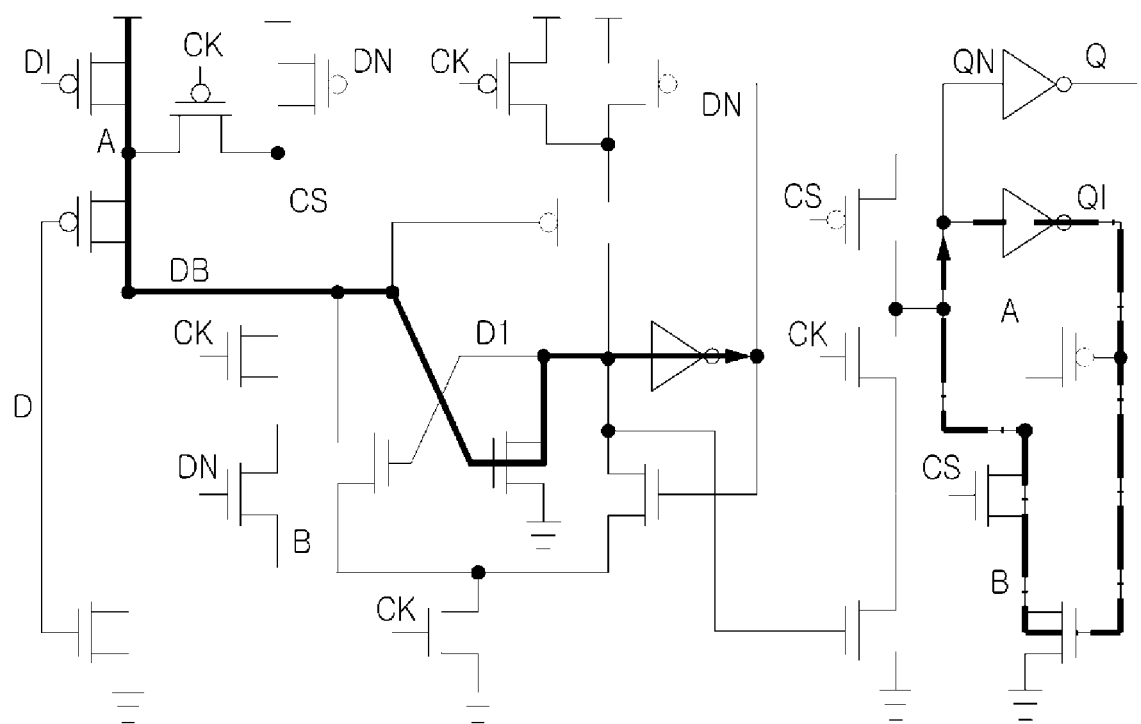
FIGS. 17A to 17D illustrate an operation process when there is a data transition of a static change-sensing flip-flop according to another example embodiment of the present invention.

FIG. 17A illustrates a circuit operation process when input data D=0, previous data $Q_{prev}$=1 (with data transition), and CK=0 in a static change-sensing flip-flop according to an example embodiment of the present invention.

Figure 17B:
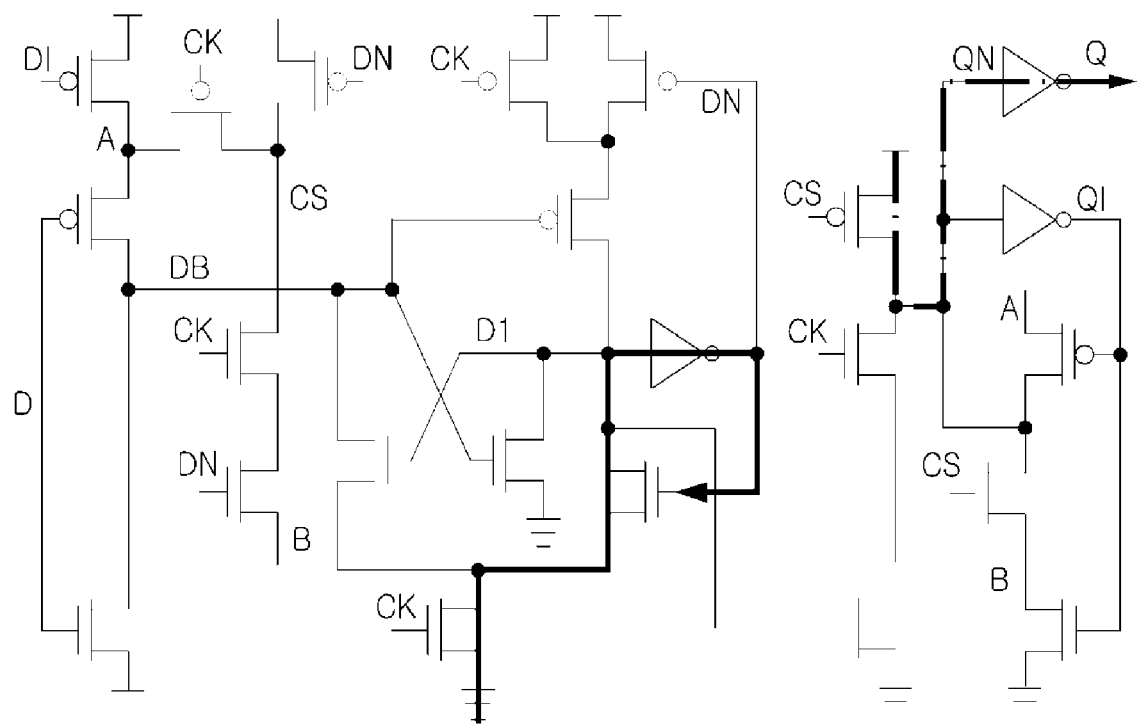

FIG. 17B illustrates a circuit operation process when input data D=0, previous data $Q_{prev}$=1 (with data transition), and CK=1 in a static change-sensing flip-flop according to an example embodiment of the present invention.

Figure 17C:
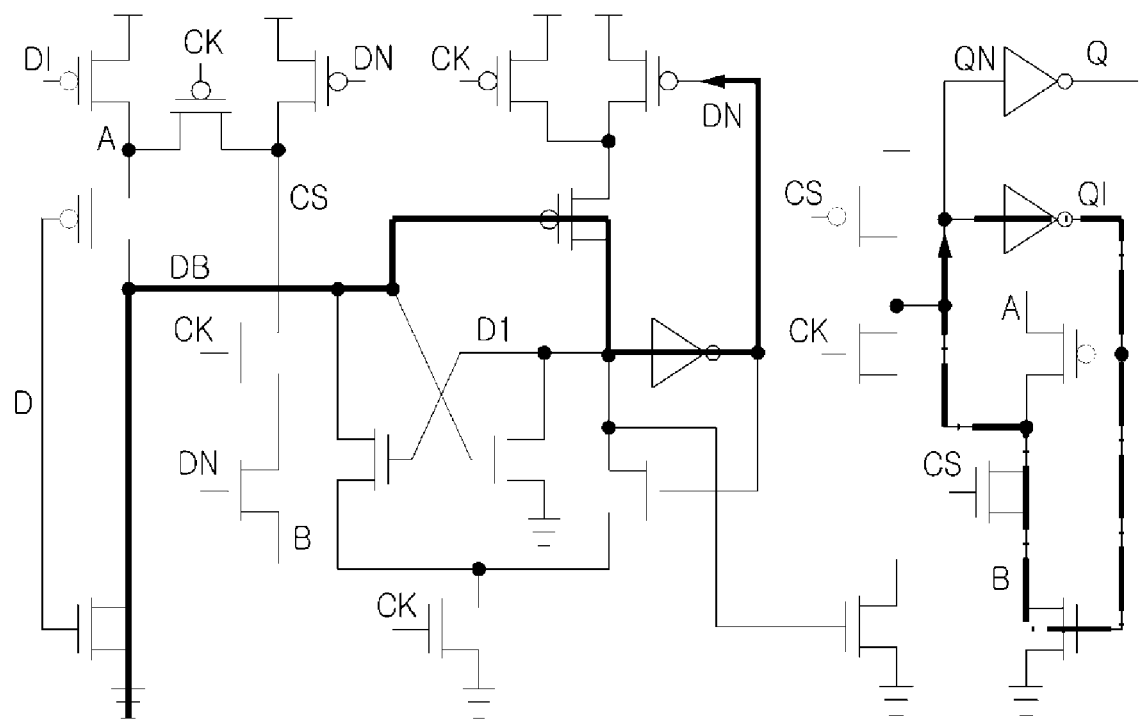

FIG. 17C illustrates a circuit operation process when input data D=1, previous data $Q_{prev}$=0 (with data transition), and CK=0 in a static change-sensing flip-flop according to an example embodiment of the present invention.

Figure 17D:
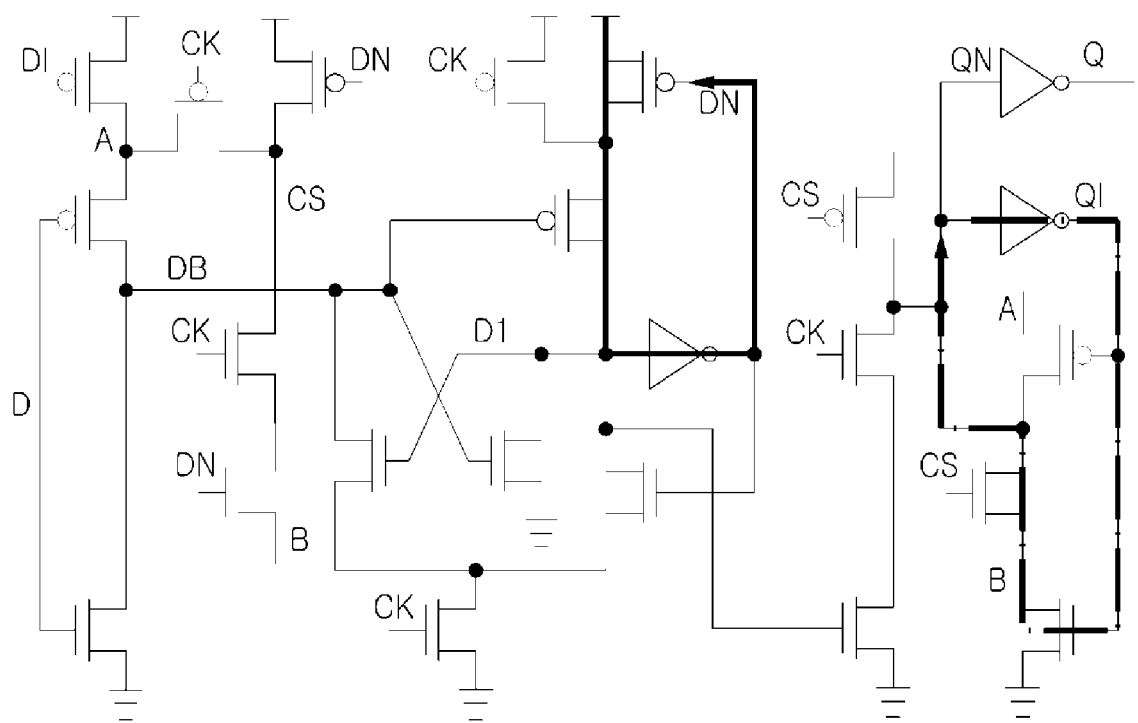

FIG. 17D illustrates a circuit operation process when input data D=1, previous data $Q_{prev}$=0 (with data transition), and CK=1 in a static change-sensing flip-flop according to an example embodiment of the present invention.

It can be seen that the static change-sensing flip-flop according to an example embodiment of the present invention exhibits a fully static and contention-free characteristic for all flip-flop operations when there is a data transition.

Although the example embodiments are described with reference to some specific example embodiments and accompanying drawings, it will be apparent to one of ordinary skill in the art that various alterations and modifications in form and details may be made from the description without departing from the spirit and scope of the claims and their equivalents. For example, suitable results may be achieved if the described techniques are performed in different order, and/or if components in a described system, architecture, device, or circuit are combined in a different manner, and/or replaced or supplemented by other components or their equivalents.

Therefore, other implementations, other example embodiments, and equivalents of the claims are to be construed as being included in the claims.

What is claimed is:

1. A static change-sensing flip-flop comprising:
a master latch and a slave latch configured to transfer and maintain input data according to a clock,
wherein the master latch comprises:
a pull-up network complementary circuit configured to connect to a master latch node (DN) and to prevent output of wrong data in a pull-up network operation while operating according to input data (D);
a pull-down network complementary circuit configured to connect to the master latch node (DN) and to prevent output of wrong data in a pull-down network operation while operating according to a clock (CK); and
a change-sensing circuit configured to prevent output of wrong data by a clock node (CS) and the master latch node (DN) in the pull-down network operation of the master latch,
wherein the pull-down network complementary circuit is configured to generate a pull-down network to prevent a down node (DN) from floating when input data (D) changes from 1 to 0 while input data (D)=1, clock (CK)=1, clock node (CS)=1, down node (DN)=0, and output data (Q)=1.

2. A static change-sensing flip-flop comprising:
a master latch and a slave latch configured to transfer and maintain input data according to a clock,
wherein the master latch comprises:
a pull-up network complementary circuit configured to connect to a master latch node (DN) and to prevent output of wrong data in a pull-up network operation while operating according to input data (D);
a pull-down network complementary circuit configured to connect to the master latch node (DN) and to prevent output of wrong data in a pull-down network operation while operating according to a clock (CK); and
a change-sensing circuit configured to prevent output of wrong data by a clock node (CS) and the master latch node (DN) in the pull-down network operation of the master latch, wherein the pull-up network complementary circuit is configured to block a pull-up network when input data (D) changes from 0 to 1 while input data (D)=0, clock (CK)=1, clock node (CS)=1, down node (DN)=1, and output data (Q)=1.

* * * * *